(12) United States Patent
Choi et al.

(10) Patent No.: US 7,224,334 B2
(45) Date of Patent: May 29, 2007

(54) ORGANIC LIGHT EMITTING DISPLAY DEVICE AND METHOD OF FABRICATING THE SAME

(75) Inventors: Joon-Hoo Choi, Seoul (KR); Chong-Chul Chai, Seoul (KR); Beohm-Rock Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 554 days.

(21) Appl. No.: 10/667,906

(22) Filed: Sep. 22, 2003

(65) Prior Publication Data

US 2004/0056828 A1    Mar. 25, 2004

(30) Foreign Application Priority Data

Sep. 25, 2002    (KR) .................... 10-2002-0058210

(51) Int. Cl.
G09G 3/32 (2006.01)
G09G 3/18 (2006.01)
(52) U.S. Cl. .................... 345/82; 345/76; 315/169.3
(58) Field of Classification Search ............ 345/76–83; 315/169.3
See application file for complete search history.

(56) References Cited

U.S. PATENT DOCUMENTS 4,739,320 A * 4/1988 Dolinar et al. ............... 345/78
6,858,991 B2 * 2/2005 Miyazawa ............... 315/169.3
2002/0118150 A1 * 8/2002 Kwon .......................... 345/76

* cited by examiner

Primary Examiner—Dennis-Doon Chow
(74) Attorney, Agent, or Firm—Cantor Colburn LLP

(57) ABSTRACT

An apparatus for providing a driving signal to an organic light emitting diode in an image display device includes gate lines for transferring previous and current gate signals, respectively, in a sequential process for providing the driving signal to the organic light emitting diode, a data line for transferring a data signal for displaying images on the image display device, a first switching transistor including a conduction path for transferring the data signal from the data line in response to the current gate signal; a second switching transistor including a conduction path for transferring a reference signal externally supplied in response to the previous gate signal, a third switching transistor including a conduction path for transferring the data signal provided from the first switching transistor in response to a state of the second switching transistor, and a fourth switching transistor including a conduction path for receiving a bias voltage and generating the driving signal to the organic light emitting diode in response to one of the reference signal from the second switching transistor and the data signal from the third switching transistor. The third and fourth switching transistors have switching characteristics substantially identical to each other.

34 Claims, 18 Drawing Sheets

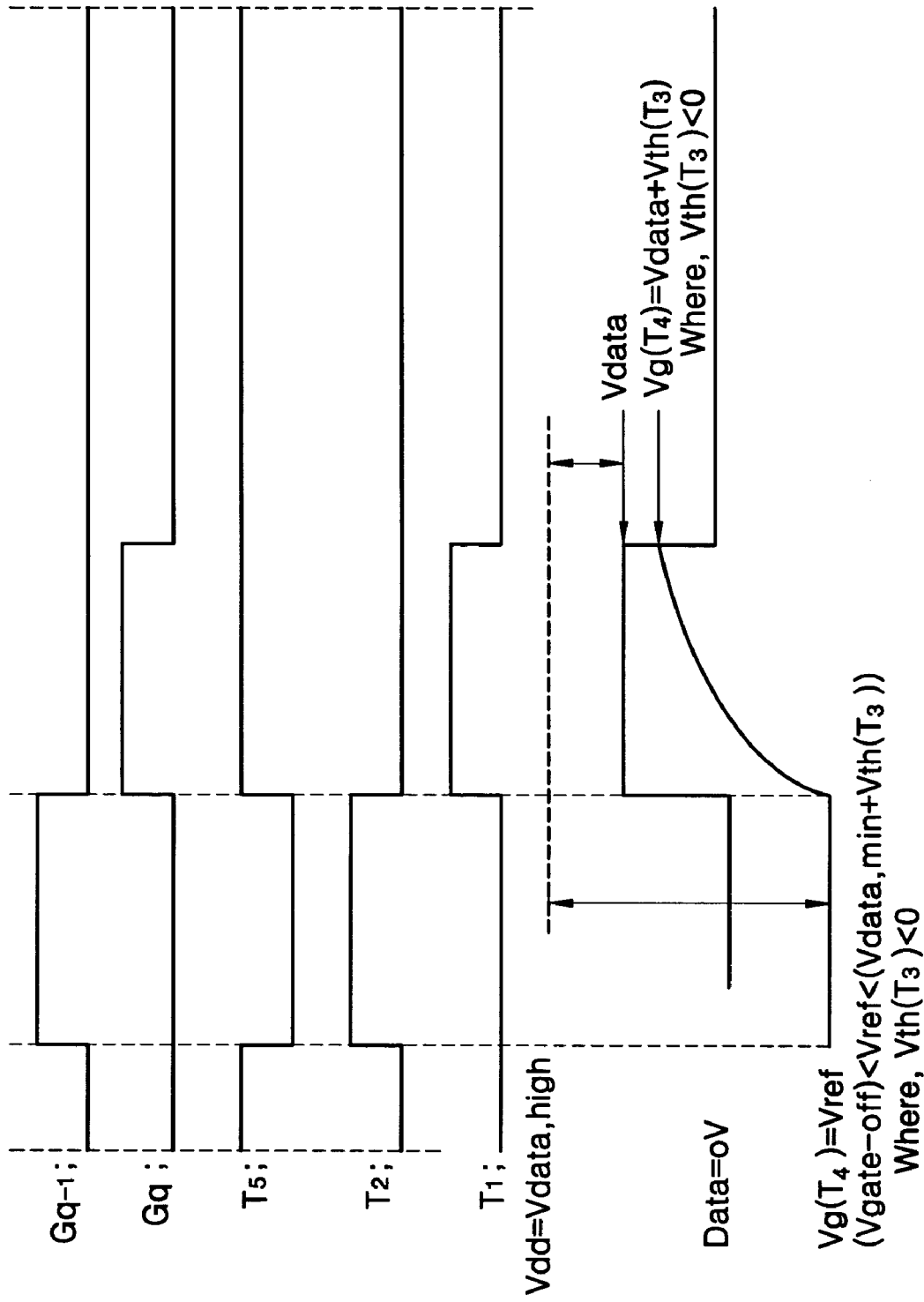

LASER SCAN DIRECTION

LASER SCAN DIRECTION

ORGANIC LIGHT EMITTING DISPLAY DEVICE AND METHOD OF FABRICATING THE SAME

BACKGROUND OF THE INVENTION

1. Field of the Invention

The present invention relates to an organic light emitting display device, and more particularly, to a device for driving pixels of an organic light emitting display device and a method of fabricating the same.

2. Description of the Related Art

Cathode ray tube (CRT) devices have been widely used for various kinds of image display devices. Recently, liquid crystal display (LCD) devices have emerged as an alternative display means for, especially, portable equipments, computer monitors, etc. However, CRT devices are generally heavy and have a big size, and LCD devices also have some unsatisfactory factors such as mediocre brightness, low efficiency, etc. In addition, LCD devices have such a drawback that images may have poor views at the side of an LCD device.

Thus, there have been made various developments for an image display device, as a new generation display means, having a lighter weight, a slimmer size, an affordable price, better efficiency, etc. One of such new generation display devices is an organic light emitting display (OLED) device. The OLED devices utilize the electroluminescence characteristics of certain organic compounds or high polymers, which emit light in response to electric current applied thereto. In the OLED devices, no backlight device is necessary for providing light to a display panel, which is required for the LCD devices. Thus, the OLED devices advantageously have a lighter weight, a smaller (and slimmer) size, a lower cost, etc. and are more readily fabricated compared with the LCD devices. In addition, the OLED devices may have superior brightness and a larger viewing angle.

FIG. 1 is a circuit diagram illustrating a conventional driving circuit for an OLED device, and FIG. 2 is a graphical view of signal waveforms applied to the driving circuit in FIG. 1. Referring to FIGS. 1 and 2, the conventional driving circuit for an OLED device includes a switching transistor $Q_S$ having a gate and a source connected to a gate line Gq and a data line Dp, respectively, a storage capacitor Cst having one terminal connected to a drain of the switching transistor $Q_S$ and the other terminal connected to a bias voltage Vdd, and a driving transistor $Q_D$ having a gate connected to the drain of the switching transistor $Q_S$ and a source connected to the bias voltage Vdd.

A driving signal is provided from a drain of the driving transistor $Q_D$ to an organic light emitting diode OLED. The organic light emitting diode OLED has one end connected to a drain of the driving transistor $Q_D$ and the other end connected to a common electrode voltage $V_{COM}$. Generally, the switching transistor $Q_S$ is an N-type thin film transistor that is turned on by applying a high-level voltage signal to its gate, and the driving transistor $Q_D$ is a P-type thin film transistor that is turned-off when the high-level voltage signal is applied to its gate.

In the operation the driving circuit in FIG. 1, when the switching transistor $Q_S$ is turned on by a gate signal provided through the gate line Gq, a data signal from the data line Dp is transferred through the conduction path of the switching transistor $Q_S$ to the gate of the driving transistor $Q_D$ as a gate voltage. The gate voltage is maintained for one frame due to the storage capacitor Cst. At this time, channel conductance of the driving transistor $Q_D$ is determined by the gate voltage applied to the gate and the bias voltage applied to the source of the driving transistor $Q_D$. Also, the intensity of a voltage applied between the ends of the organic light emitting diode OLED is determined based on a voltage distribution of the organic light emitting diode OLED with respect to the voltage between the bias voltage Vdd and the common electrode voltage $V_{COM}$, where the organic light emitting diode OLED and the driving transistor $Q_D$ are connected each other in series. The organic light emitting diode OLED emits light in response to current flowing therein, which is corresponding to the intensity of the voltage determined based on the voltage distribution.

Thus, even if the same data signal is applied to the gate of the driving transistor $Q_D$ SO that the gate-source voltage $V_{GS}$ of the driving transistor $Q_D$ has an identically value in different driving circuits for different pixels of the OLED device, the voltage distribution may vary depending on characteristics of the driving transistor $Q_D$ in different pixels so that the intensity of the voltage between the ends of organic light emitting diode may vary as well. As a result, the current flowing the organic light emitting diode OLED may be different in different pixels of the OLED device. Such variation in the current flowing the organic light emitting diode OLED may cause deterioration in brightness of pixels and display quality of the OLED device.

Therefore, it is desired that the driving circuit of an OLED device is improved so that every organic light emitting diode in the respective pixels of the OLED device receives the same driving current in response to the same data signal so as to emit the same amount of light.

BRIEF SUMMARY OF THE INVENTION

The present invention provides a pixel driving unit for an OLED device that compensates for characteristics of a driving thin film transistor in the pixel driving unit to improve the display quality of the OLED device. The present invention also provides a method of fabricating such a pixel driving unit for an OLED device.

In one aspect of the invention, a pixel driving unit for providing a driving signal to an organic light emitting diode in an OLED device includes first and second control lines for transferring previous and current control signals, respectively, in a sequential process for providing the driving signal to the organic light emitting diode, a data line for transferring a data signal for displaying images on the image display device, a first switching device including a conduction path for transferring the data signal from the data line, the conduction path of the first switching device being controlled by the current control signal from the second control line, a second switching device including a conduction path for transferring a reference signal externally supplied, the conduction path of the second switching device being controlled by the previous control signal from the first control line, a third switching device including a conduction path for transferring the data signal provided from the first switching device, the conduction path of the third switching device being controlled by a state of the second switching device, and a fourth switching device including a conduction path for receiving a bias voltage and generating the driving signal to the organic light emitting diode, the conduction path of the fourth switching device being controlled by one of the reference signal from the second switching device and the data signal from the third switching device.

In the pixel driving unit, the third and fourth switching devices may have switching characteristics substantially identical to each other. Also, a capacitor may be included for being charged with the bias voltage and for providing a voltage signal to control the conduction path of the third switching device. The first, second, third and fourth switching devices may be first, second, third and fourth thin film transistors, respectively, each having a conduction path between a source and a drain and a gate for receiving a control signal to control the conduction path. The first and second control signal lines may be first and second gate lines, respectively, and the previous and current control signals may be previous and current gate signals, respectively.

In another aspect of the present invention, an organic light emitting display device includes gate lines to which an active gate line is sequentially supplied, data lines to which data signals are applied to display images on the organic light emitting display device and pixel driving units each of which provides a driving signal to a corresponding OLE diode in association with a pair of the gate lines and a pair of the data lines, in which each of the pixel driving units has a driving transistor having a conduction path with one terminal receiving a bias voltage and the other terminal providing the driving signal to the diode, a first switching transistor having a conduction path for transferring a reference signal, the conduction path of the first switching transistor being controlled by a previous gate signal, and a second switching transistor having a conduction path for transferring a data signal, the conduction path of the second switching transistor being controlled by a state of the first switching transistor. The conduction path of the driving transistor may be controlled by one of the reference signal from the first switching transistor and the data signal from second switching transistor. The gate lines may include a dummy gate line for providing a gate signal to the first switching transistor of a first one of the pixel driving units.

In another aspect of the present invention, there is provided a method for fabricating a semiconductor device for providing a pixel driving signal in an organic light emitting display device. The method includes providing an insulation substrate, forming on the insulation substrate a first amorphous silicon thin film transistor for providing the pixel driving signal to an organic light emitting diode, forming on the insulation substrate a second amorphous silicon thin film transistor for transferring a data signal to control a switching function of the first amorphous silicon thin film transistor, crystallizing the first and second amorphous silicon thin film transistors by performing a laser scan on the first and second amorphous silicon thin film transistor, and transforming the first and second amorphous silicon thin film transistor into first and second polysilicon thin film transistors, respectively, by consummating the crystallizing step. The first and second polysilicon thin film transistors may have characteristics substantially identical to each other.

These and other objects, features and advantages of the present invention will become apparent from the following detailed description of the exemplary embodiments thereof, which is to be read in conjunction with the accompanying drawings, wherein like elements are designated by identical reference numbers throughout the several views.

BRIEF DESCRIPTION OF THE DRAWINGS

The above and other advantages of the present invention will become readily apparent by reference to the following detailed description when considered in conjunction with the accompanying drawings wherein:

FIG. 4 is a graphical view of signal waveforms applied to the pixel driving unit in FIG. 3;

DETAILED DESCRIPTION OF THE INVENTION

Detailed illustrative embodiments of the present invention are disclosed herein. However, specific structural and functional details disclosed herein are merely representative for purposes of describing exemplary embodiments of the present invention.

Figure 1:
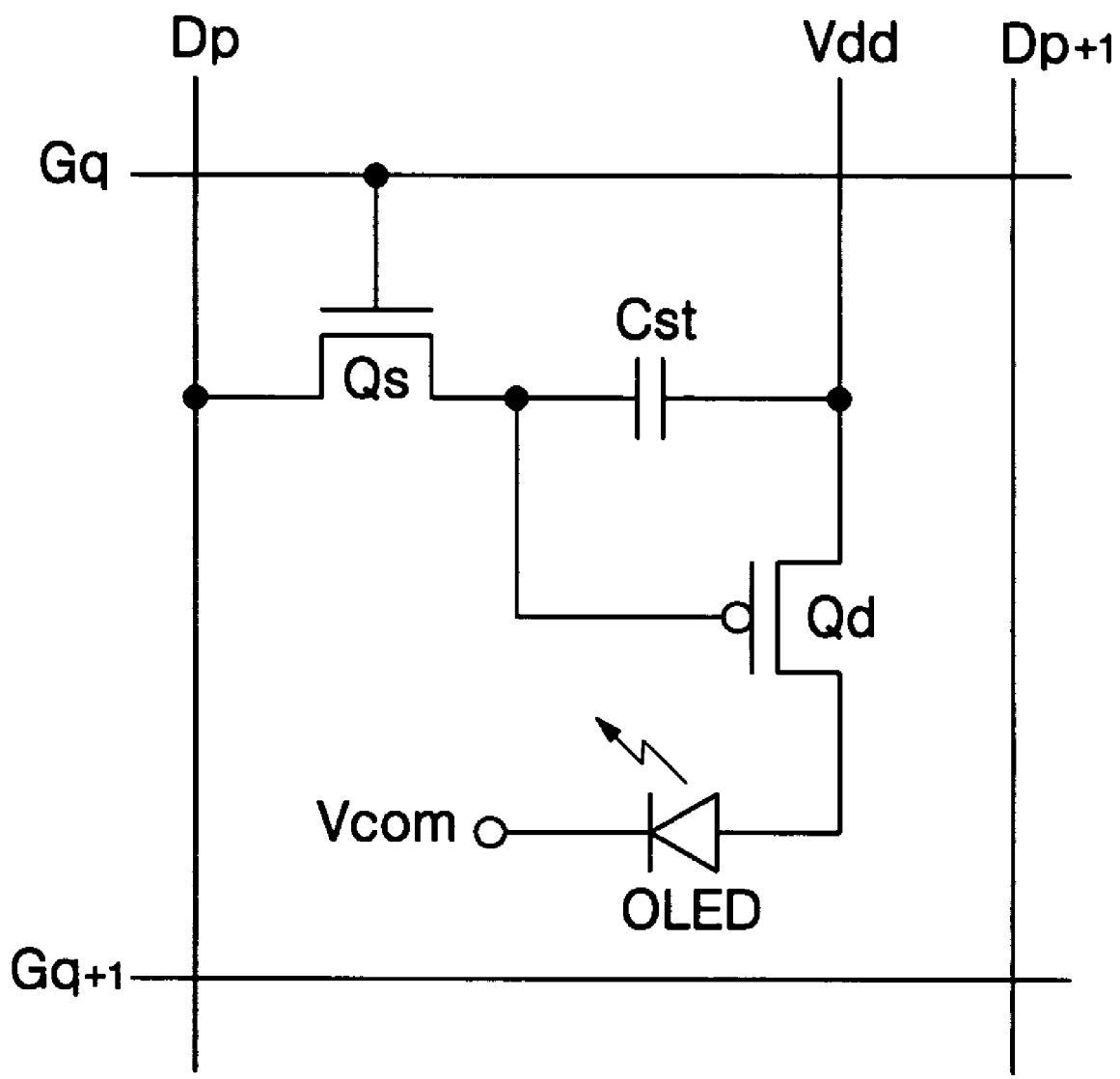
FIG. 1 is a circuit diagram illustrating a conventional driving circuit for an OLED device.
Figure 2:
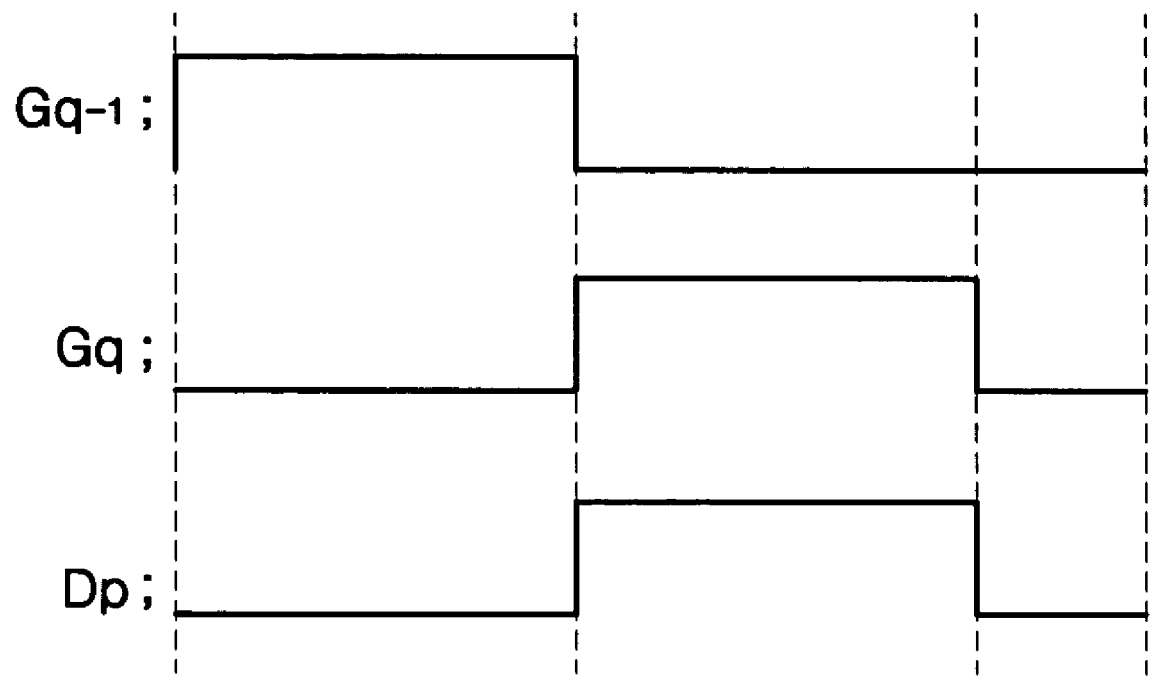
FIG. 2 is a graphical view of signal waveforms applied to the driving circuit in FIG. 1.
Figure 3:
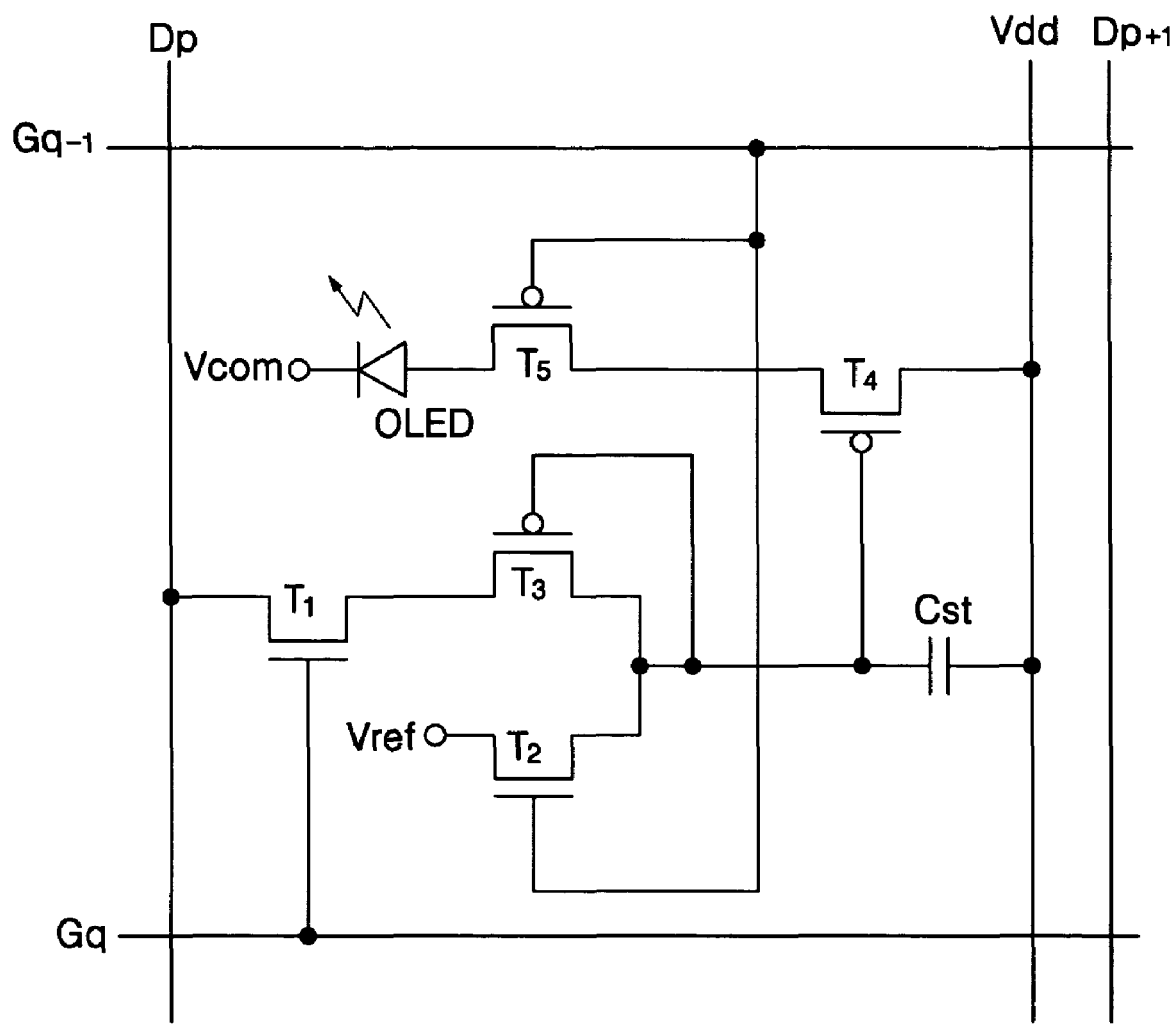
FIG. 3 is a circuit diagram illustrating a pixel driving unit for an OLED device according to a first embodiment of the present invention.

FIG. 3 is a diagram illustrating a pixel driving unit of an organic light emitting display (OLED) device according to a first exemplary embodiment of the present invention, and FIG. 4 is a graphical view of signal waveforms applied to the pixel driving unit in FIG. 3.

In FIG. 3, the pixel driving unit of an OLED device includes five transistors, for example, first to third thin film transistors $T_1$–$T_3$ each having a switching function and fourth and fifth thin film transistors $T_4$, $T_5$ each having a driving function. The pixel driving unit also includes a storage capacitor Cst for storing electric charge and an OLED diode for emitting light in response to a driving signal applied from the fifth thin film transistor $T_5$. The OLED diode has a first terminal receiving the driving signal from the fifth transistor $T_5$ and a second terminal connected to a common electrode voltage $V_{COM}$. In this embodiment, the five thin film transistors $T_1$–$T_5$, the storage capacitor Cst, and the OLED diode are the elements mainly constituting the pixel driving unit for a unit pixel of an OLED device.

The pixel driving units are arranged in association with gate lines and data lines of the OLED device such that each pixel driving unit is disposed in a region surrounded by adjacent gate lines and adjacent data lines. Power supply lines each providing a bias voltage Vdd for the OLED device is also arranged such that each power supply line is parallel with a corresponding data line $D_{p+1}$. A selected number of the pixel driving units of the OLED device are connected to the power supply line Vdd, and the number of the pixel driving units is equal to the number of the gate lines. The power supply line Vdd may be formed as a single metal layer (e.g., MoW layer) or dual metal layers (e.g., MoW layer and AlNd layer).

As shown in FIG. 3, one pixel driving unit (or one unit pixel) is defined by $p_{th}$ and $(p+1)_{th}$ data lines and $(q-1)_{th}$ and $q_{th}$ gate lines in an OLED device having a resolution of m×n×3. In the pixel driving unit, for example, the first and second thin film transistors $T_1$, $T_2$ are N-type transistors, which are each turned on when a gate signal higher than the threshold voltage of a corresponding transistor is applied to its gate. The third to fifth thin film transistors $T_3$–$T_5$ are P-type transistors, which are each turned on when a gate signal lower than the threshold voltage of a corresponding transistor is applied to its gate. In particular, the first thin film transistor $T_1$ has a gate connected to a present gate line $G_q$ and a source connected to a data line Dp. The first thin film transistor $T_1$ transmits a data signal, which is inputted through the source, to the third thin film transistor $T_3$ through the drain thereof in response to the gate signal applied through the present gate line $G_q$.

The second thin film transistor $T_2$ has a gate connected to a previous gate line $Gq_{-1}$ and a source connected to a reference voltage line to which a reference voltage $V_{ref}$ is supplied. The second thin film transistor $T_2$ transmits the reference voltage $V_{ref}$, which is inputted through the source, to the fourth thin film transistor $T_4$ through the drain thereof in response to the gate signal applied through the previous gate line $Gq_{-1}$. In other words, the second thin film transistor $T_2$ has a conduction path between the reference voltage $V_{ref}$ and the gate of the fourth thin film transistor $T_4$, and the conduction path is controlled by the gate signal applied from the previous gate line.

The third thin film transistor $T_3$ has a source connected to the drain of the first thin film transistor $T_1$, and a gate and a drain commonly connected to the drain of the second thin film transistor, the storage capacitor Cst and the gate of the fourth thin film transistor $T_4$. The third thin film transistor $T_3$ transmits the data signal transferred through the first thin film transistor $T_1$ to the fourth thin film transistor $T_4$ as a gate control signal of the fourth thin film transistor $T_4$. In other words, the third thin film transistor $T_3$ has a conduction path to transfer the data signal from the data line Dp to the gate of the driving transistor, i.e., the fourth thin film transistor $T_4$. The conduction path of the third thin film transistor $T_3$ is controlled by a state of the second thin film transistor $T_2$. In other words, the third thin film transistor $T_3$ is turned on when the second thin film transistor $T_2$ is turned off. The second and third thin film transistors are parallel to each other with respect to the fourth thin film transistor, and provide the reference voltage and the data signal, respectively, to the gate of the fourth thin film transistor.

The fourth thin film transistor $T_4$ has a source connected to the power supply line for supplying the bias voltage Vdd. The gate of the fourth thin film transistor $T_4$ is connected in common to one terminal of the storage capacitor Cst, the drain of the second thin film transistor, and the drain of the third thin film transistor $T_3$. The fourth thin film transistor $T_4$ has a conduction path to transfer the bias voltage Vdd to the fifth thin film transistor $T_5$, and the conduction path is controlled by a gate signal, either the reference signal from the second thin film transistor $T_2$ or the data signal from the third thin film transistor $T_3$. The fourth thin film transistor $T_4$ has characteristics similar or substantially identical to that of the third thin film transistor $T_3$.

The fifth thin film transistor $T_5$ has a source connected to a drain of the fourth thin film transistor $T_4$, a drain connected to the OLED diode, and a gate connected to the previous gate line $Gq_{-1}$. The fifth thin film transistor $T_5$ outputs the driving signal (e.g., the bias voltage $V_{dd}$) provided from the fourth thin film transistor $T_4$ to the OLED diode in response to a gate signal applied through the previous gate line $Gq_{-1}$. In other words, the fifth thin film transistor $T_5$ has a conduction path controlled by the previous gate signal to provide the driving signal to the OLED diode. The OLED diode emits light in response to the driving signal. The OLED diode has two terminals, one connected to the drain of the fifth thin film transistor and the other connected to the common electrode voltage $V_{COM}$.

The storage capacitor Cst has two terminals, one commonly connected to the drains of the second and third transistors and the gates of the third and fourth transistors $T_3$, $T_4$ and the other connected to the bias voltage Vdd. The storage capacitor Cst is charged with the bias voltage Vdd and supplies a high-level signal (e.g., the bias voltage $V_{dd}$) to the second through fourth thin film transistors $T_2$–$T_4$ for one frame. When the previous gate line $Gq_{-1}$ has a logic-high signal, the second transistor $T_2$ is turned on so that the voltage stored in the storage capacitor Cst is discharged through the second transistor of which source electrode a reference signal Vref of logic-low is applied to. As a result, the reference signal Vref is applied to the gate of the fourth transistor $T_4$.

Figure 5A:
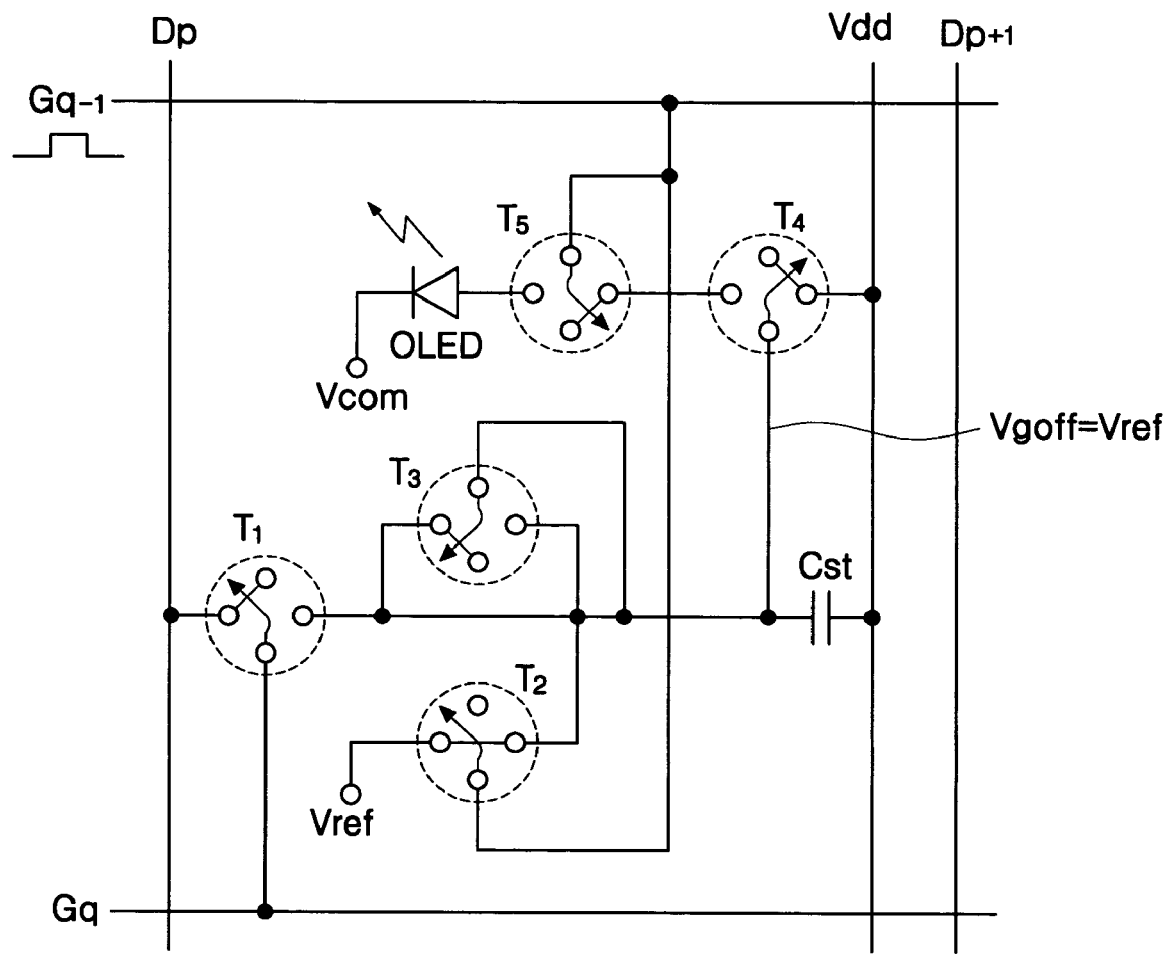
FIGS. 5A and 5B are schematic diagrams for describing the operation of the pixel driving unit in FIG. 3.
Figure 5B:
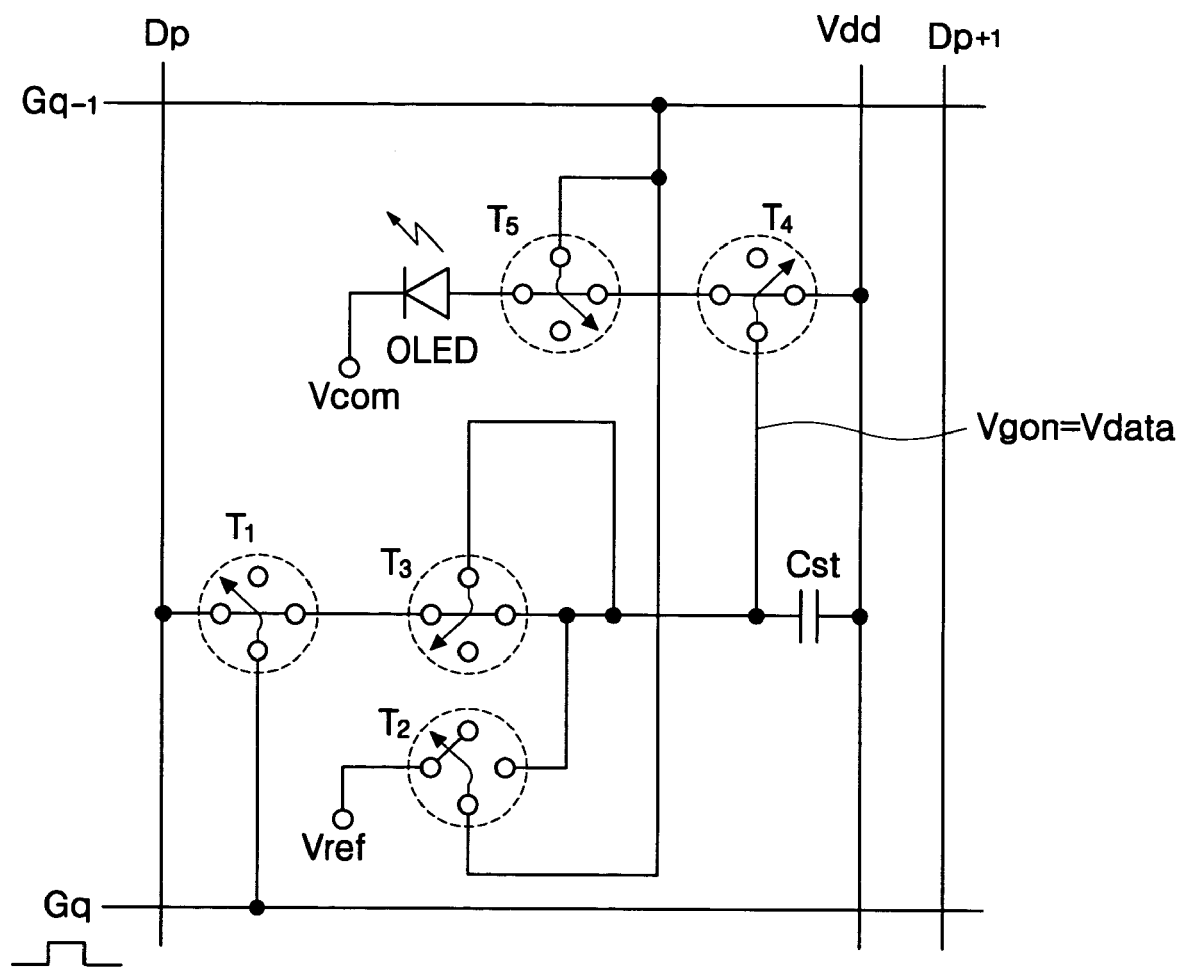

Hereinafter, a further detail description of the operation of the switching and driving transistors of the pixel driving unit in FIG. 3 follows. FIGS. 5A and 5B are schematic diagrams for describing the operation of the pixel driving unit of an OLED device in FIG. 3. The operation status of the thin film transistors $T_1$–$T_5$ of the pixel driving unit is shown in FIG. 5A when an active gate signal is applied to the previous gate line, and also in FIG. 5B when an active gate signal is applied to the present gate line.

Referring to FIG. 5A, when an active gate signal (e.g., a high level pulse signal) is applied to the previous gate line, the first, third, fourth and fifth thin film transistors $T_1$, $T_3$, $T_4$, $T_5$ are turned off and the second thin film transistor $T_2$ is turned on. As a result, the reference voltage $V_{ref}$ supplied from the reference voltage line is applied to the gate of the fourth thin film transistor $T_4$. The reference voltage $V_{ref}$ may be defined as following Equation 1.

$$[V_{gate\text{-}off(T1)}] \leq V_{ref} \leq [V_{data,min} + V_{th(T3)}] \qquad \text{Equation 1}$$

Here, $V_{gate\text{-}off(T1)}$ is a gate-off voltage of the first thin film transistor $T_1$, $V_{data,min}$ is the minimum voltage value of a data signal applied to the data line $D_p$, and $V_{th(T3)}$ is a threshold voltage of the third thin film transistor $T_3$, which is a negative voltage. In this condition, the gate-off voltage of the fourth thin film transistor $T_4$ becomes the reference voltage Vref, and the gate-off voltage of the third thin film transistor $T_3$ also becomes the reference voltage Vref.

Referring to FIG. 5B, when an active gate signal (e.g., a high level pulse signal) is applied to the present gate line, the first thin film transistor $T_1$ is turned on and the second thin film transistor $T_2$ is turned off. As a result, a data signal applied from the data line is transferred to the third thin film transistor $T_3$ through the conduction path of the first thin film transistor. The storage capacitor Cst charged with the data signal voltage Vdata provides a high-level voltage to the gate of the third thin film transistor $T_3$. Then, the third thin film transistor $T_3$ is turned on and the data signal provided from the first thin film transistor $T_3$ is transferred to the gate of the fourth thin film transistor $T_4$. At this time, an effective gate-source voltage $Vgs'_{(T4)}$, which determines the intensity of current flowing the conduction path of the fourth thin film transistor $T_4$, is defined as following Equation 2.

$$Vgs'_{(T4)} = Vgs_{(T4)} + Vth_{(T4)} \qquad \text{Equation 2}$$

Here, the gate-source voltage $Vgs_{(T4)}$ of the fourth thin film transistor $T_4$ is the difference between a gate voltage of the fourth thin film transistor $T_4$ and the bias voltage Vdd, as expressed in following Equation 3.

$$Vgs_{(T4)} = Vg_{(T4)} - Vdd \qquad \text{Equation 3}$$

Here, the gate voltage $Vg_{(T4)}$ of the fourth thin film transistor $T_4$ is the difference between a data voltage (i.e., a voltage value of the data signal) and a threshold voltage Vth of the third thin film transistor $T_3$, as expressed in following Equation 4.

$$Vg_{(T4)} = Vdata + Vth_{(T3)} \qquad \text{Equation 4}$$

Here, the threshold voltage $Vth_{(T3)}$ of the third thin film transistor $T_3$ is a negative voltage. Assuming that the characteristics of the third and fourth thin film transistors $T_3$, $T_4$ are substantially identical to each other, the threshold voltage Vth of the third thin film transistor $T_3$ is substantially identical to that of the fourth thin film transistor $T_4$.

$$Vth_{(T3)} = Vth_{(T4)} \qquad \text{Equation 5}$$

From Equations 2 to 5, the effective gate-source voltage $Vgs'_{(T4)}$ determining the intensity of current flowing the fourth thin film transistor $T_4$ is obtained as follows:

$$Vgs'_{(T4)} = Vdata - Vdd \qquad \text{Equation 6}$$

As shown in Equation 6, the effective gate-source voltage $Vgs'_{(T4)}$ of the fourth thin film transistor $T_4$ is the difference between the data voltage Vdata provided through the data line Dp and the bias voltage Vdd provided through the external power supply line. Accordingly, the effective gate-source voltage $Vgs'_{(T4)}$ of the fourth thin film transistor $T_4$ in every pixel of the OLED device is only dependent on intensities of the data voltage Vdata applied through the data line Dp and the bias voltage Vdd applied through the external power supply line. In other words, the effective gate-source voltage $Vgs'_{(T4)}$ of the driving transistor, which determines the intensity of current flowing the driving transistor, is independent of the threshold voltage Vth of the driving transistor (i.e., the fourth thin film transistor $T_4$).

Therefore, by employing in each pixel driving unit of the OLED device the third and fourth thin film transistors $T_3$, $T_4$ having the substantially same characteristics, the pixel driving unit compensates for the characteristics (especially, the threshold voltage Vth) of the fourth thin film transistor $T_4$, which would be different in different pixels. As a result, the driving transistor of each pixel driving unit provides the OLED diode with current having the substantially same intensity in response to a same data signal even if the driving transistor (e.g., the fourth thin film transistor $T_4$) of a pixel has a different threshold voltage from that of another pixel.

Figure 6:
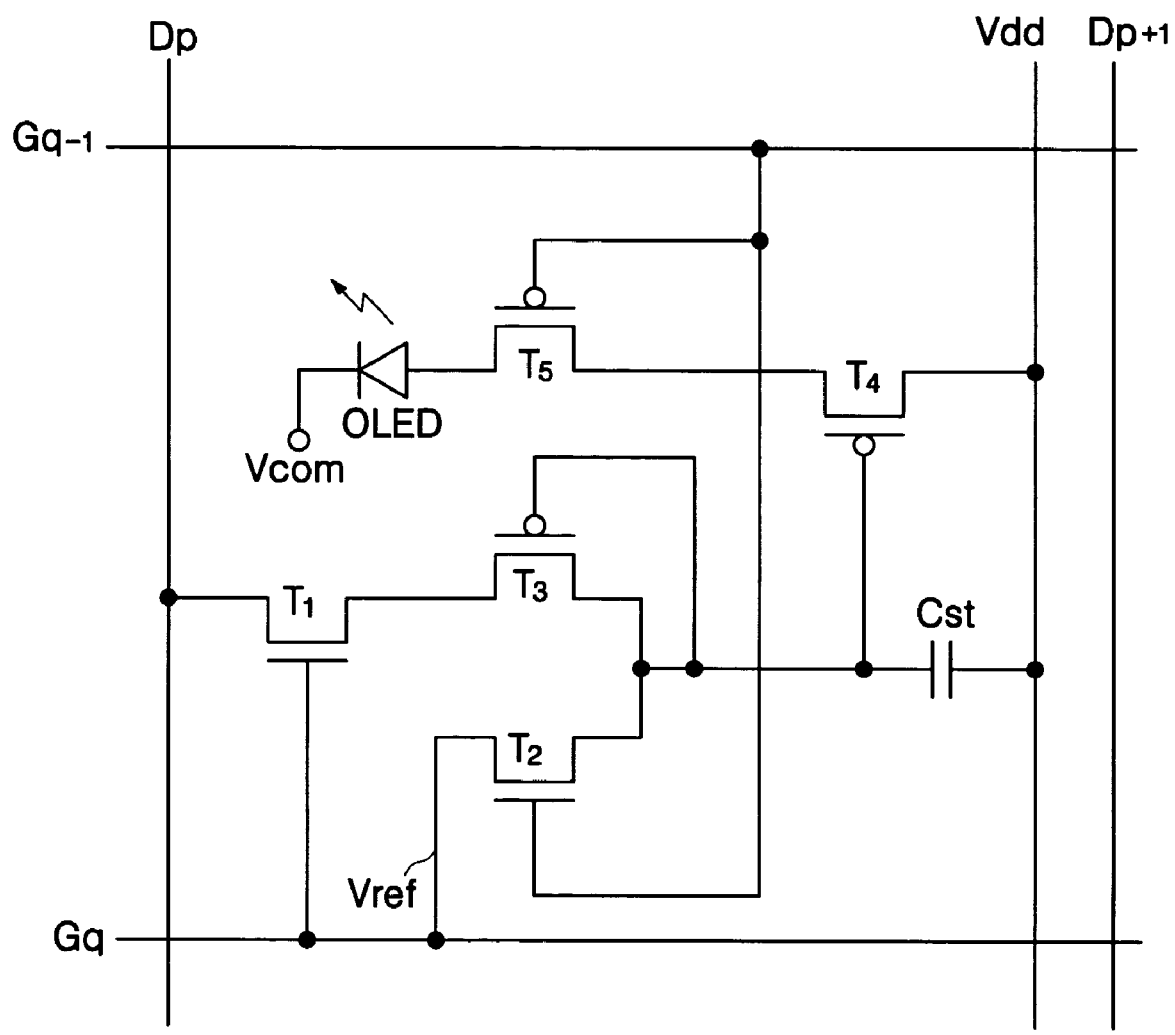
FIG. 6 is a circuit diagram illustrating a pixel driving unit for an OLED device according to a second embodiment of the present invention.

Referring to FIG. 6, there is provided a pixel driving unit for an OLED device according to a second exemplary embodiment of the present invention. In this embodiment, the pixel driving unit does not require a separate line for providing the reference voltage Vref. In the circuit diagram of FIG. 6, the pixel driving unit for an OLED device includes first to third thin film transistors $T_1$–$T_3$ each having a switching function, fourth and fifth thin film transistors $T_4$, $T_5$ each having a driving function, a storage capacitor Cst, and an OLED diode connected to a common electrode voltage $V_{COM}$. Each pixel driving unit is aligned in a region surrounded by gate lines for transferring gate signals and data lines for transferring data signals. In FIG. 6, the parts equivalent to those in FIG. 3 are represented with like reference numerals and description thereof is omitted to avoid duplication.

In this embodiment, a gate signal applied through the current gate line $G_q$ serves as the reference voltage Vref for the second thin film transistor $T_2$. For example, the drain of the second thin film transistor $T_2$ is connected to the current gate line $G_q$ in common with the gate of the first thin film transistor $T_1$.

In the operation of the pixel driving unit, when an active gate signal (e.g., a high-level pulse signal) is applied to the previous gate line $Gq-_1$, the first, third, fourth and fifth thin film transistors $T_1$, $T_3$, $T_4$, $T_5$ are turned off and the second thin film transistor $T_2$ is turned on. As a result, the reference voltage Vref is applied to the gate of the fourth thin film transistor $T_4$ through the second thin film transistor $T_2$. Since the reference voltage Vref is a gate signal applied to the present gate line that is inactive when the previous gate line is selected to receive an active gate signal, the reference voltage Vref is an off-level signal.

When an active gate signal is applied to a present gate line $G_q$, the first thin film transistor $T_1$ is turned on, so that a data signal (e.g., a high-level voltage signal) applied from the data line $D_p$ to the source of the first thin film transistor $T_1$ is transferred to the third thin film transistor $T_3$ through the conduction path of the first thin film transistor $T_1$. At this time, the storage capacitor Cst charged with the data signal voltage Vdata provides a high-level voltage to the gate of the third thin film transistor $T_3$ to turn on the third thin film transistor $T_3$. Then, the data signal transmitted through the first and third thin film transistors $T_1$, $T_3$ is supplied to the gate of the fourth thin film transistor $T_4$. Therefore, as mentioned above, no separate reference line is necessary in this embodiment.

Figure 7:
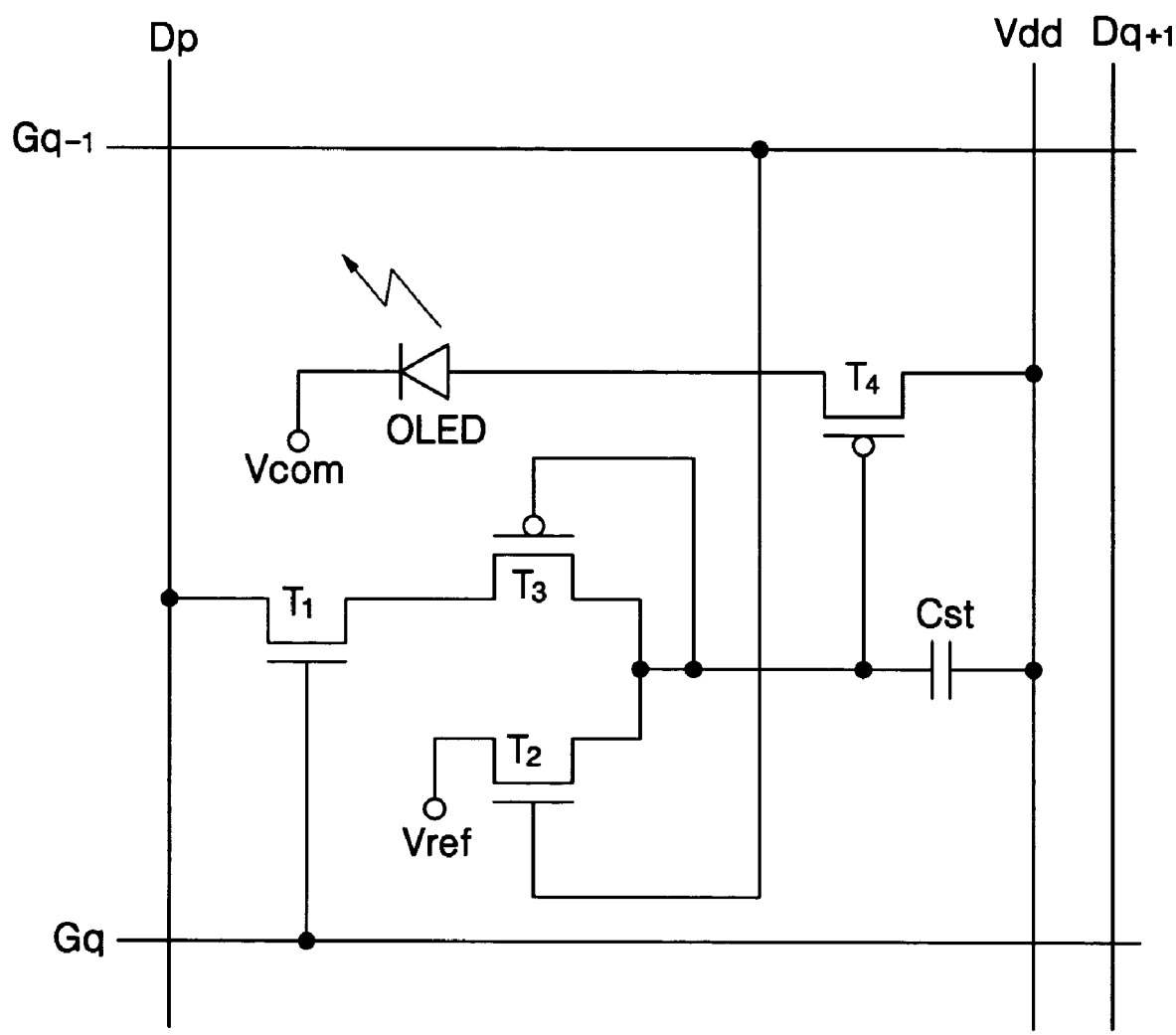
FIG. 7 is a circuit diagram illustrating a pixel driving unit for an OLED device according to a third embodiment of the present invention.

FIG. 7 is a circuit diagram illustrating a pixel driving unit for an OLED device according to a third exemplary embodiment of the present invention. Referring to FIG. 7, the pixel driving unit includes first to third thin film transistors $T_1$ to $T_3$ each having a switching function, a fourth thin film transistors $T_4$ having a driving function, a storage capacitor Cst, and an OLED diode connected to a common electrode voltage $V_{COM}$, which constitute a unit pixel of the OLED device. The pixel driving unit is aligned in a region surrounded by adjacent gate lines for transferring gate signals and adjacent data lines for transferring data signals. In FIG. 7, the parts equivalent to those in FIG. 3 are represented with like reference numerals and description thereof is omitted to avoid duplication. In the pixel driving unit of this embodiment, the fifth thin film transistor $T_5$ is omitted from the pixel driving unit according to the first embodiment of the present invention in FIG. 3.

When an active gate signal is applied to the previous gate line $Gq-_1$, the first, third and fourth thin film transistors $T_1$, $T_3$, $T_4$ are turned off and the second thin film transistor $T_2$ is turned on. As a result, a reference voltage Vref supplied from a reference voltage line to the source of the second thin film transistor $T_2$ is applied to the gate of the fourth thin film transistor $T_4$. In this embodiment, the reference voltage Vref is the same as the one described in Equation 1.

Also, when an active gate signal is applied to a present gate line $G_q$, the first thin film transistor $T_1$ is turned on so that a data signal applied through the data line $D_p$ to the source of the first thin film transistor $T_1$ is transferred to the third thin film transistor $T_3$ through the conduction path of the first thin film transistor $T_1$. At this time, since the storage capacitor Cst charged with the data signal voltage Vdata provides a high-level voltage to the gate of the third thin film transistor $T_3$, the third thin film transistor $T_3$ is turned on. Thus, the data signal passing through the first and third thin film transistors $T_1$, $T_3$ is supplied to the gate of the fourth thin film transistor $T_4$.

In like manner, the pixel driving unit of this embodiment compensates its pixel driving function for any variance in the threshold voltage Vth of the fourth thin film transistor $T_4$, which would have a characteristic different from that of a fourth thin film transistor in another pixel driving unit of the same OLED device. With such compensation, the pixel driving unit provides the OLED diode with the same current as a driving signal in response to the same data signal independent of the varying characteristics of the driving transistor in different pixel driving units.

Figure 8:
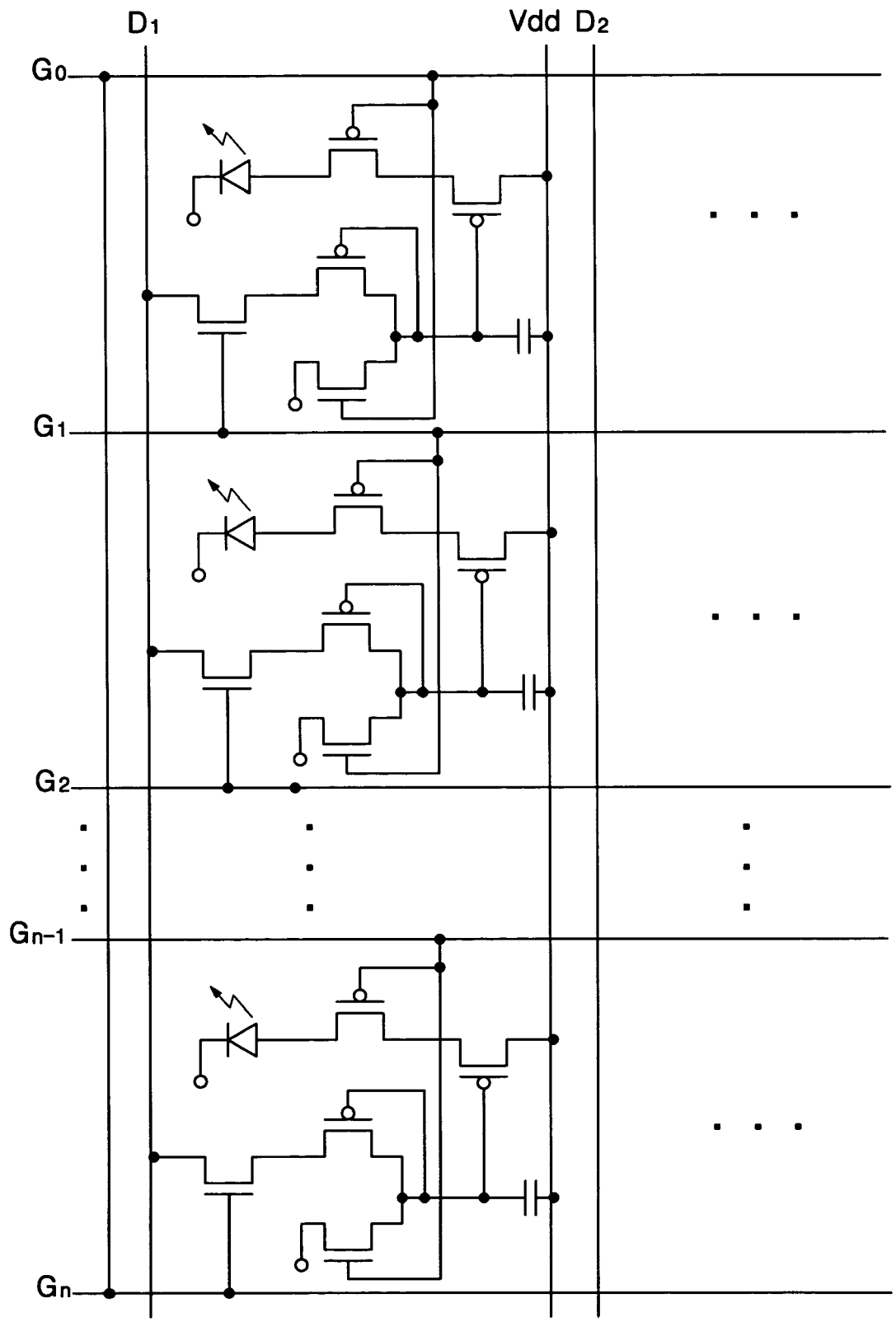
FIG. 8 is a circuit diagram illustrating multiple pixel driving units of an OLED device arranged in association with gate and data lines according to an embodiment of the present invention.

FIG. 8 is a circuit diagram illustrating multiple pixel driving units of an OLED device arranged in association with gate and data lines according to an embodiment of the present invention. In this embodiment, the multiple pixel driving units each have the structure identical to that of the embodiment in FIG. 3. Referring to FIG. 8, the OLED device has multiple pixel driving units arranged in a matrix form respectively corresponding to the pixels of the OLED device. The OLED device in this embodiment has "n" pixel driving units (i.e., "n" pixels) in a column and "n" gate lines $G_1$–$G_n$ each associated with a corresponding one of the "n" pixel driving units. The OLED device sequentially provides a gate signal, as a scanning signal, to the respective gate lines.

In addition to the "n" gate lines $G_1$, $G_2$ ... $G_{n-1}$, and $G_n$ for the "n" pixel driving units, the OLED device also has a dummy gate line $G_0$ to supply a gate signal to the gates of the second and fifth thin film transistors $T_2$ and $T_5$ of the pixel driving unit in association with the first gate line $G_1$. The dummy gate line $G_0$ is synchronized with the $n_{th}$ gate line $G_n$. By synchronizing the dummy gate line $G_0$ with the $n_{th}$ gate line $G_n$, the dummy gate line $G_0$ is prevented from remaining in a floating state.

Alternatively, the dummy gate line $G_o$ may receive a separate gate signal from a gate driver instead of being synchronized with the $n_{th}$ gate line $G_n$. In other words, a gate driver sequentially provides the "n" gate signals to the "n" gate lines, respectively, to drive a selected gate line. When the gate driver provides a gate signal to the $n_{th}$ gate line $G_n$, it also provides the same gate signal to the dummy gate line $G_o$ simultaneously. Thus, the dummy gate line $G_o$ has the same effect as being synchronized with the $n_{th}$ gate line $G_n$ and is prevented from remaining in the floating state.

In the above embodiments of FIGS. 3 to 8, the pixel driving units (or the pixels) of an OLED device are arranged in a matrix form such that each pixel driving unit is defined by the adjacent gate lines expanded in the row direction and arranged parallel with each other in the column direction and the adjacent data lines expanded in the column direction and arranged parallel with each other in the row direction. Also, a power supply line is expanded in the column direction and arranged parallel with the data lines to provide a bias voltage to a driving transistor of the respective pixel driving units.

In this configuration, such arrangement of the power supply line parallel with the corresponding data line may cause the "cross-talk" phenomenon in the OLED device. In other words, when the power supply line is expanded in the column direction parallel with the data line as shown in FIG. 8, a full-level bias voltage is applied to a first pixel driving unit, but the level of the bias voltage may be gradually lowered as it is applied to lower pixels. As a result, a voltage difference may exist between the gate-source voltage $V_{gs1(T4)}$ of the fourth thin film transistor $T_4$ in the first pixel driving unit and the gate-source voltage $V_{gsn(T4)}$ of the fourth thin film transistor $T_4$ in the $n_{th}$ pixel driving unit. Due to the difference of the gate-source voltage between the pixel driving units, a voltage difference may exist between sources of the fourth thin film transistors in the respective pixel driving units, even if data voltage having the same level is applied to the pixel driving units. Such "cross-talk" phenomenon may be increased in the lower pixels, thereby causing deterioration in display quality of the OLED device.

Figure 9:
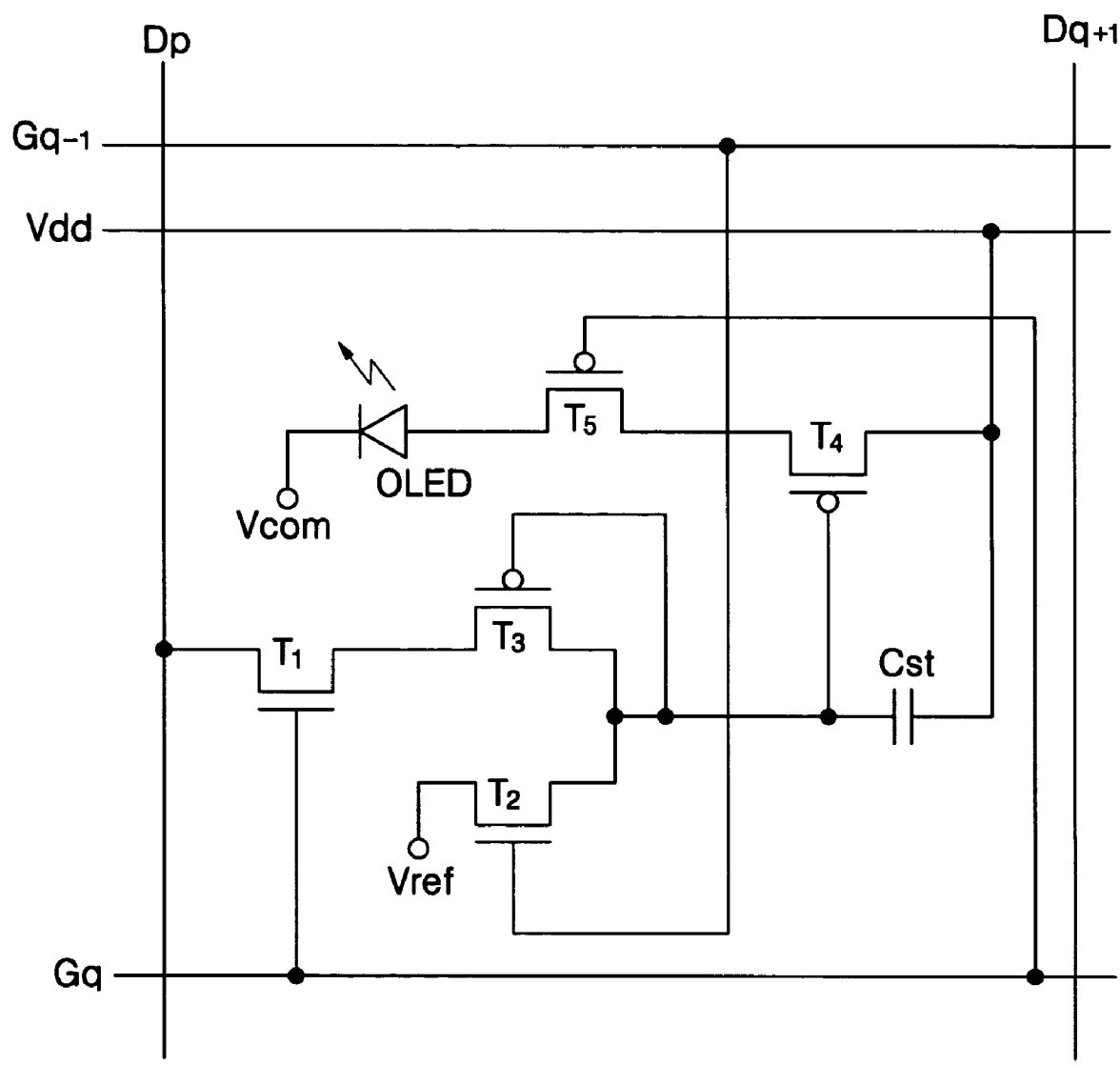
FIG. 9 is a circuit diagram illustrating a pixel driving unit for an OLED device according to a fourth embodiment of the present invention.

FIG. 9 is a circuit diagram illustrating a pixel driving unit for an OLED device according to a fourth exemplary embodiment of the present invention. In this embodiment, the power supply line Vdd is expanded in the row direction and arranged parallel with the gate lines, thereby effectively reducing the "cross-talk" phenomenon. Referring to FIG. 9, the pixel driving unit according to the fourth embodiment of the present invention includes first to third thin film transistors $T_1$–$T_3$ each having a switching function, fourth and fifth thin film transistors $T_4$, $T_5$ each having a driving function, a storage capacitor Cst, and an OLED diode connected to a common electrode voltage $V_{COM}$, which are the elements mainly constituting a unit pixel of the OLED device. The pixel driving units are arranged in a matrix form in the OLED device such that each pixel driving unit is defined in a region surrounded by two adjacent gate lines each for transferring a gate signal and two adjacent data lines each for transferring a data signal. In FIG. 9, the parts equivalent to those in FIG. 3 are represented with like reference numerals and description thereof is omitted to avoid duplication. In this embodiment, the gate of the fifth thin film transistor $T_5$ is connected to the present gate line $G_q$, so that the fifth thin film transistor $T_5$ is turned on or off in response to a gate signal provided through the present gate signal.

In the operation of the pixel driving unit in FIG. 9, when an active gate signal (e.g., a high-level pulse signal) is applied to the previous gate line $Gq_{-1}$, the first, third and fourth thin film transistors $T_1$, $T_3$, $T_4$ are turned off and the second and fifth thin film transistors $T_2$, $T_5$ are turned on. As a result, the reference voltage Vref supplied from a reference voltage line is applied to the gate of the fourth thin film transistor $T_4$. The reference voltage Vref used in this embodiment is the same as the one described in Equation 1.

When an active gate signal is applied to the present gate line $G_q$, the first thin film transistor $T_1$ is turned on so that a data signal applied from the data line $D_p$ to the source of the first thin film transistor $T_1$ is transferred to the drain of the third thin film transistor $T_3$. At this time, the storage capacitor Cst charged with the data signal voltage Vdata provides a high-level voltage to the gate of the third thin film transistor $T_3$, so that the third thin film transistor $T_3$ is turned on. Thus, the data signal passing through the first and third thin film transistors $T_1$, $T_3$ is supplied to the gate of the fourth thin film transistor $T_4$. Then, the fourth thin film transistor $T_4$ provides the bias voltage to the fifth thin film transistor through its conduction path in response to the data signal applied to its gate. The fifth thin film transistor $T_5$ is turned off when a signal of the present gate line $G_q$ becomes logic high. Subsequently, when the previous gate line signal becomes logic high and the present gate line signal becomes logic low, the fifth thin film transistor $T_5$ is turned on and maintains the active (i.e., turned-on) state until the next frame.

In this embodiment, as described above, the "cross-talk" phenomenon is effectively eliminated by disposing the power supply line expanded in the row direction parallel with the gate lines, while compensating the driving operation of the pixel driving units for varying characteristics of the fourth thin film transistor $T_4$ in different pixel driving units.

Figure 10:
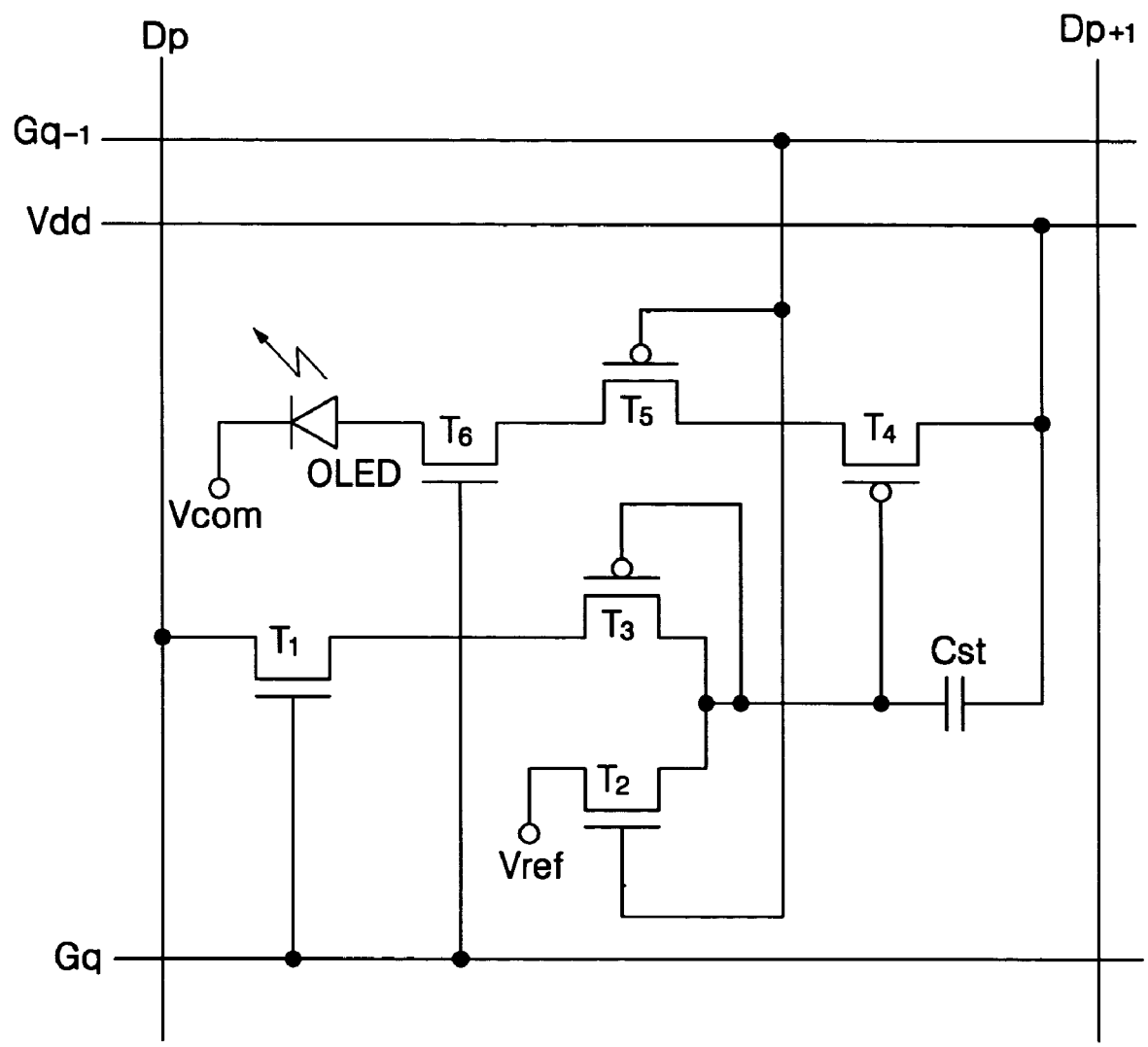
FIG. 10 is a circuit diagram illustrating a pixel driving unit for an OLED device according to a fifth embodiment of the present invention.

FIG. 10 is a circuit diagram illustrating a pixel driving unit for an OLED device according to a fifth exemplary embodiment of the present invention. In FIG. 10, the same parts as those shown in FIG. 3 are represented with light reference numerals. In this embodiment, the power supply line is expanded in the row direction parallel with the gate lines and an additional thin film transistor $T_6$ is provided between the fifth thin film transistor and the OELD diode.

Referring to FIG. 10, the pixel driving unit includes first to third thin film transistors $T_1$–$T_3$ each having a switching function, fourth to sixth thin film transistors $T_4$–$T_6$ each having a driving function, a storage capacitor Cst, and the OLED diode connected to a common electrode voltage $V_{COM}$, which are the elements mainly constituting a unit pixel of the OLED device. Each of the pixel driving units of the OLED device is disposed in a region surrounded by adjacent gate lines each for transferring a gate signal and adjacent data lines each for transferring a data signal. In this embodiment, the fifth thin film transistor $T_5$ is a P-type thin film transistor and has the gate connected to the previous gate line $G_{q-1}$ so as to be turned on or off in response to a gate signal provided through the previous gate signal. Also, the sixth thin film transistor $T_6$ is an N-type thin film transistor and has the source connected to the drain of the fifth thin film transistor $T_5$, the drain connected to the OLED diode, and the gate connected to the present gate line $G_q$. The sixth thin film transistor $T_6$ is thus turned on or off in response to a gate signal applied through the present gate signal $G_q$.

In operation, when an active gate signal is applied to the previous gate line Gq−1, the first, third, fourth, fifth and sixth thin film transistors $T_1$, $T_3$, $T_4$, $T_5$, $T_6$ are turned off and the second thin film transistor $T_2$ is turned on. Thus, the reference voltage Vref supplied from a reference voltage line is applied to the gate of the fourth thin film transistor $T_4$. The reference voltage Vref is the same as the one described in Equation 1.

When an active gate signal is applied to the present gate line $G_q$, the first thin film transistor $T_1$ is turned on so that a data signal applied from the data line $D_p$ to the source of the first thin film $T_1$ transistor is transferred to the drain of the third thin film transistor $T_3$ through the conduction path of the first thin film transistor $T_1$. Also, the second thin film transistor is turned off because the previous gate line is inactivated. Thus, the data signal passing through the first and third thin film transistors $T_1$, $T_3$ is supplied to the gate of the fourth thin film transistor $T_4$. Accordingly, the conduction path of the fourth thin film transistor is controlled by the data signal provided from the source of the third thin film transistors $T_3$.

In this embodiment, as mentioned for the fourth embodiment above, the "cross-talk" phenomenon existing between adjacent pixels arranged in the column direction is effectively eliminated by aligning the power supply line expanded in the row direction parallel with the gate lines.

In the pixel driving units of the first through fifth embodiments of the present invention, the first and second thin film transistors $T_1$, $T_2$ are N-type thin film transistors and the third to fifth thin film transistors $T_3$, $T_4$, $T_5$ are P-type thin film transistors. However, the present invention is not limited to such configuration. For example, a pixel driving unit of the present invention may include first to fourth thin film transistors $T_1$–$T_4$ which one is P-type thin film transistors and a fifth thin film transistor $T_5$ which is an N-type thin film transistor.

Figure 11:
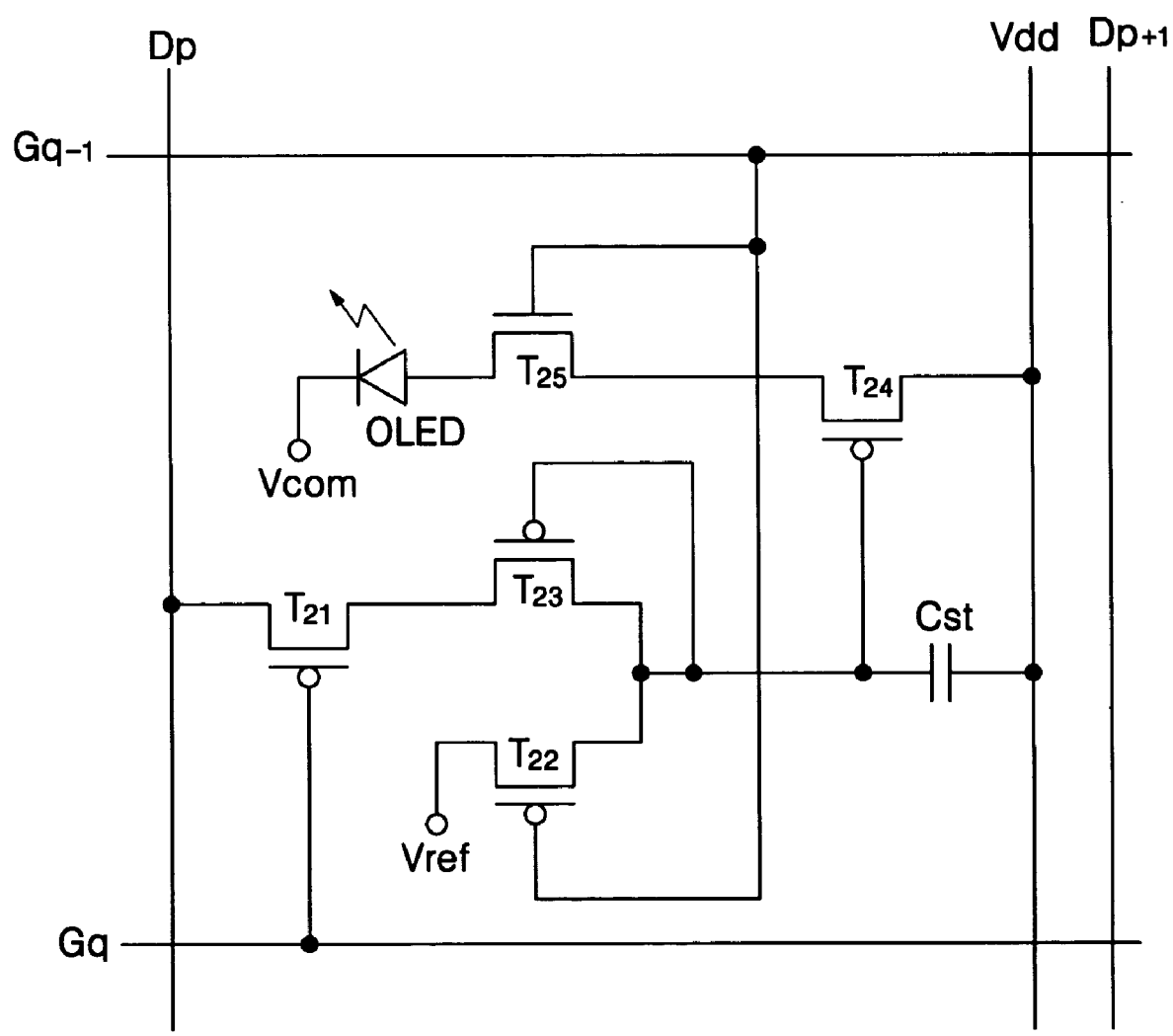
FIG. 11 is a circuit diagram illustrating a pixel driving unit for an OLED device according to a sixth embodiment of the present invention.
Figure 12:
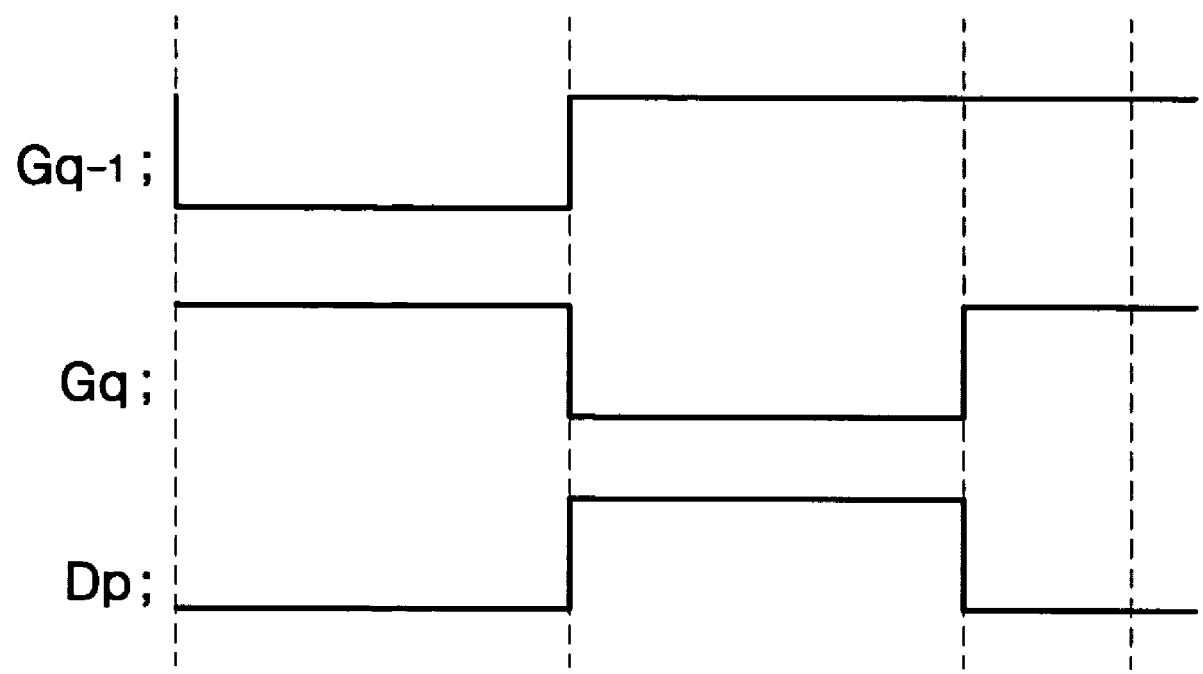
FIG. 12 is a graphical view of signal waveforms applied to the pixel driving unit in FIG. 11.

FIG. 11 is a circuit diagram illustrating a pixel driving unit for an OLED device according to a sixth exemplary embodiment of the present invention, and FIG. 12 is a graphical view of signal waveforms applied to the pixel driving unit in FIG. 11. Referring to FIG. 11, the pixel driving unit includes first to third thin film transistors $T_{21}$–$T_{23}$ each having a switching function, fourth and fifth thin film transistors $T_{24}$, $T_{25}$ each having a driving function, a storage capacitor Cst, and an OLED diode connected to a common electrode voltage $V_{COM}$, which constitute a unit pixel of the OLED device. The pixel driving unit is disposed in a region surrounded by adjacent gate lines for transferring gate signals and adjacent data lines for transferring data signals. Since the first to fourth thin film transistors $T_{21}$–$T_{24}$ are P-type thin film transistors, they are each turned on when a gate signal having a level lower than its threshold voltage is applied to the gate of the corresponding one of the first to fourth thin film transistors $T_{21}$–$T_{24}$. The fifth thin film transistor $T_{25}$ is an N-type thin film transistor, thus it is turned on when a gate signal having a level higher than its threshold voltage is applied to the gate of the fifth thin film transistor $T_{25}$.

As shown in FIG. 12, the gate signals respectively applied to the gate lines are inversed signals. In other words, since the first thin film transistor $T_{21}$ is a P-type thin film transistor, the first thin film transistor $T_{21}$ is maintained inactive when the gate signal applied to the current gate line $G_q$ has a high-level. In contrast, the first thin film transistor $T_{21}$ is maintained active when the gate signal applied to the current gate line $G_q$ has a low-level (i.e., active low signal). In order to supply such inversed gate signals to the pixel driving unit for the OLED device, an inverter is provided in a gate driver that sequentially outputs the gate signals.

In the operation of the pixel driving unit, when the previous gate line is activated (i.e., a low-level gate signal is applied to the previous gate line Gq−1 and a high-level gate signal is applied to the current gate line), the first, third, fourth and fifth thin film transistors $T_1$, $T_3$, $T_4$, $T_5$ are turned off and the second thin film transistor $T_2$ is turned on. Thus, the reference voltage Vref is applied to the gate of the fourth thin film transistor $T_4$. In this case, the reference voltage Vref may be defined as following Equations 7 and 8.

$$V_{ref} < V_{gate\text{-}off(T21)} \qquad \text{Equation 7}$$

Here, $V_{gate\text{-}off(T21)}$ is a gate-off voltage of the first thin film transistor $T_{21}$.

$$V_{ref} < [V_{data,min} + V_{th(T23)}] \qquad \text{Equation 8}$$

Here, $V_{data,min}$ is the minimum voltage value of a data signal applied to the data line Dp, and $V_{th(T23)}$ is the threshold voltage of the third thin film transistor $T_{23}$.

Next, when the current gate line $G_q$ is activated (i.e., a low-level gate signal is applied to the current gate line $G_q$ and a high-level gate signal is applied to the previous gate line $G_{q-1}$), the first thin film transistor $T_{21}$ is turned on so that a data signal applied to the source of the first thin film transistor $T_{21}$ is transferred to the drain of the third thin film transistor $T_{23}$. At this time, since the storage capacitor Cst charge with the data signal voltage provides a high-level voltage to the gate of the third thin film transistor $T_{23}$, the third thin film transistor $T_{23}$ is turned on. Thus, the data signal passing through the first and third thin film transistor $T_{21}$, $T_{23}$ is supplied to the gate of the fourth thin film transistor $T_{24}$. At this time, an effective gate-source voltage $Vgs'_{(T24)}$ determining the intensity of current flowing the fourth thin film transistor $T_{24}$ is represented by following Equation 9.

$$Vgs'_{(T24)} = Vgs_{(T24)} - Vth_{(T24)} \qquad \text{Equation 9}$$

Here, the gate-source voltage of the fourth thin film transistor $T_{24}$ is the difference between the gate voltage of the fourth thin film transistor $T_{24}$ and the bias voltage $V_{dd}$. The gate-source voltage is represented by following Equation 10.

$$Vgs_{(T24)} = Vg_{(T24)} - Vdd \qquad \text{Equation 10}$$

Here, the gate voltage of the fourth thin film transistor $T_{24}$ is the difference between the data voltage and the threshold voltage of the third thin film transistor $T_{23}$, and it is represented by following Equation 11.

$$Vg_{(T24)} = Vdata + Vth_{(T23)} \qquad \text{Equation 11}$$

Here, since the characteristics of the third and fourth thin film transistors $T_3$, $T_4$ are substantially identical to each other, threshold voltage Vth of the third thin film transistor $T_{23}$ is the same as that of the fourth thin film transistor $T_{24}$ as follows.

$$Vth_{(T23)} = Vth_{(T24)} \qquad \text{Equation 12}$$

Therefore, from Equations 9 through 12, the effective gate-source voltage of the fourth thin film transistor $T_{24}$ is obtained as following Equation 13.

$$Vgs'_{(T24)} = Vdata - Vdd \qquad \text{Equation 13}$$

As expressed in Equation 13, the effective gate-source voltage $Vgs'_{(T24)}$ determining the intensity of current flowing the fourth thin film transistor $T_{24}$ is the voltage difference between the data voltage Vdata applied through the data line Dp and the bias voltage $V_{dd}$ applied through the external power supply line. Accordingly, the effective gate-source voltage $Vgs'_{(T24)}$ of each of the fourth thin film transistors $T_{24}$ respectively disposed in all the pixel driving units is only dependent on the intensity of the data voltage Vdata applied through the data line Dp and the bias voltage $V_{dd}$ applied through the external power supply line. The gate-source voltage $Vgs'_{(T24)}$ is, however, independent of the threshold voltage Vth of the fourth thin film transistor $T_{24}$.

In this embodiment, the pixel driving unit compensates the driving operation of the fourth thin film transistor $T_4$ for its varying characteristics such that the threshold voltage Vth of a fourth thin film transistor $T_4$ in a pixel driving unit may be different from that of another fourth thin film transistor in another pixel driving unit. With such a compensation, the same current is provided to the OLED diode in response to the same data signal independent of the threshold voltage of the fourth thin film transistor $T_4$, even when the driving transistors (i.e., the fourth thin film transistors $T_{24}$) have different threshold voltages in different pixel driving units. It is assumed that the pixel driving unit of the present invention has the third and fourth thin film transistors of which characteristics (e.g., threshold voltages) are similar or substantially identical to each other.

The thin film transistors employed in the pixel driving units for an OLED device according to the present invention each have a multi-layered structure including a semiconductor layer, an insulation layer, a protection layer and an electrode layer. The semiconductor layer includes amorphous silicon or polysilicon. The insulation layer includes silicon nitride ($SiN_X$), silicon oxide ($SiO_2$), aluminum oxide ($AL_2O_2$) and tantalum oxide (TaOx). The protection layer includes transparent organic insulating material or insulating material. The electrode layer includes conductive metal, for example, Al, Cr and Mo. Each of the multiple layers is fabricated as a thin film by using a deposition apparatus, such as a sputtering device and a chemical vapor deposition device. Then, the thin films are subjected to a lithography process to form the elements of the pixel driving units for the OLED device.

Of the multiple layers, the semiconductor layer serves as an electrical conduction channel through which electrons are moved, and the electrode layer includes a source electrode, a drain electrode and a gate electrode. The source electrode applies a voltage signal to the semiconductor layer, and the voltage signal traveling the semiconductor layer is output through the drain electrode. The gate electrode is a means for controlling (e.g., switching) the current flow from the source electrode to the drain electrode.

Thus, the thin film transistors with such configuration may be used as switching devices in an active matrix type OLED device. The thin film transistors of the active matrix type OLED device each have a semiconductor layer made of material including cadmium selenide (CdSe), hydrogenous amorphous silicon (a-Si:H), or poly crystalline silicon (poly-Si).

The amorphous silicon can be processed at a low temperature with a simple process, so that it has been used for a large-scale device, for example, a solar cell. In addition, a semiconductor manufacturing process using the amorphous silicon may be carried out in a low temperature processing system at the maximum temperature of about 350° C., so that the semiconductor device can be easily fabricated in case of using the amorphous silicon. However, electrons in the amorphous silicon move at a very low speed, thereby deteriorating switching characteristics of the thin film transistors. In addition, it is difficult to integrate driving circuitry controlling the thin film transistors at a high speed with the thin film transistors. In contrast, a thin film transistor having a semiconductor layer including polysilicon is adapted for the active matrix type OLED device.

Although the thin film transistor having the semiconductor layer including polysilicon requires an additional process, the polysilicon thin film transistor that serves as a switching device provided in the active matrix type OLED device has a response speed faster than that of the amorphous silicon thin film transistor. In addition, the polysilicon thin film transistor has superior field effect mobility as compared with that of the amorphous silicon thin film transistor. The field effect mobility determines a switching speed of the thin film transistor. The switching speed of the polysilicon thin film transistor is remarkably faster than the switching speed of the amorphous silicon thin film transistor.

This is because the polysilicon consists of various grains and has a low defect as compared with amorphous silicon. Thus, polysilicon can be used for a switching device in a next-generation OLED device having a large screen while allowing the drive circuitry to be integrated with the thin film transistor. The polysilicon thin film transistor may be fabricated through a solid phase crystallization (SPC) process in which amorphous silicon is crystallized at a high temperature, a metal induced crystallization (MIC) process in which heat is applied to metal deposited on amorphous silicon, or an excimer laser annealing process using a laser. The excimer laser annealing process can be carried out at a low temperature with using an inexpensive glass substrate, so it can save manufacturing cost. In addition, the thin film transistor manufactured through the excimer laser annealing process has high mobility of signals, so that the operational characteristic of a semiconductor device is improved.

Hereinafter, methods of fabricating a polysilicon thin film transistor by crystallizing an amorphous silicon thin film transistor using a laser will be described with reference to the accompanying drawings.

Figure 13A:
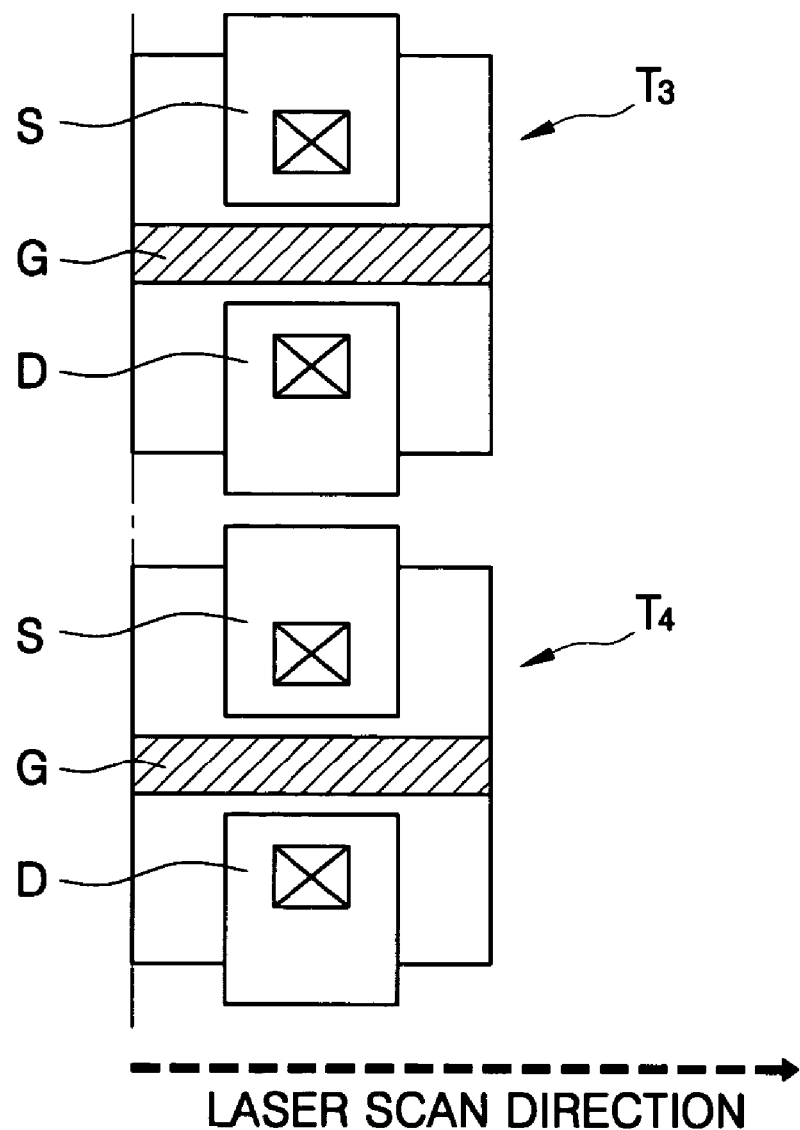
FIGS. 13A and 13B are schematic diagrams each illustrating two thin film transistors fabricated according to an exemplary embodiment of the present invention.
Figure 13B:
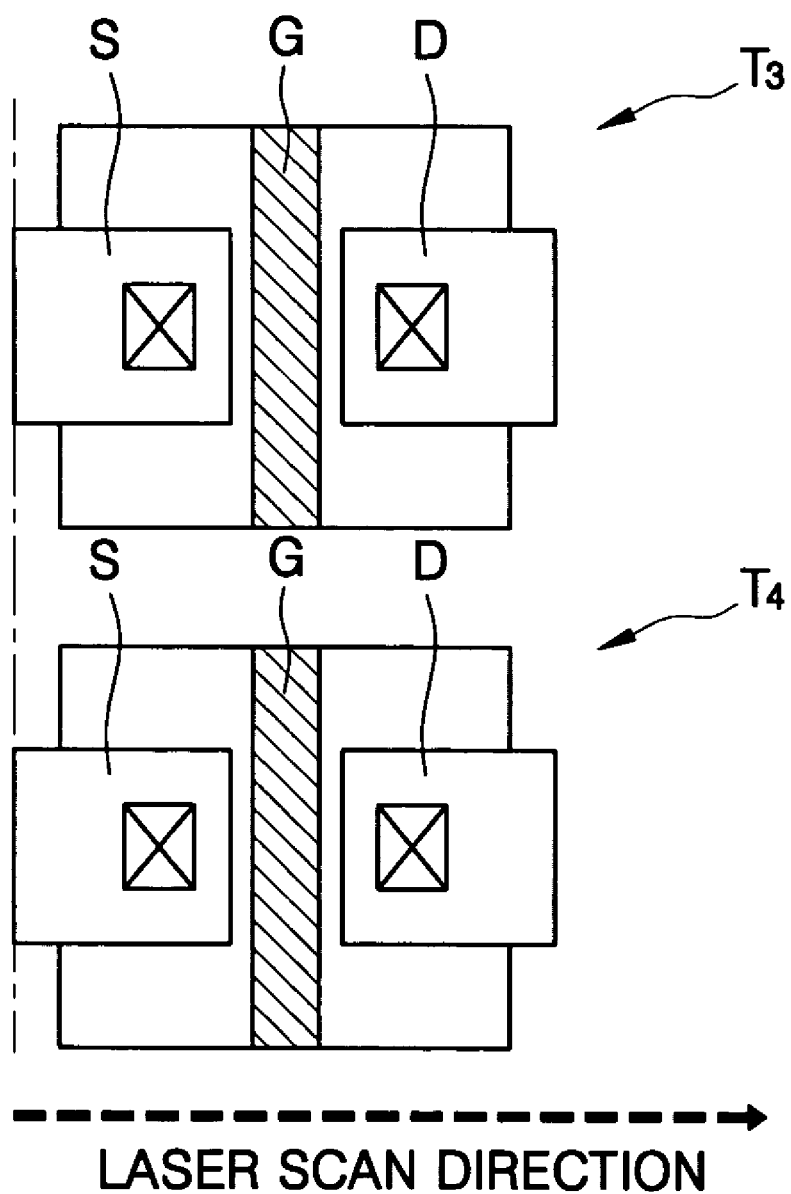

FIGS. 13A and 13B are schematic diagrams each illustrating two thin film transistors fabricated according to an exemplary embodiment of the present invention. The two thin film transistors are the third and fourth thin film transistors $T_3$ (or $T_{23}$), $T_4$ (or $T_{24}$) in the pixel driving unit of the present invention (referring to FIGS. 3–11). As described above, the third and fourth thin film transistors in the pixel driving unit have the characteristics similar or substantially identical to each other. According to a method of fabricating the two thin film transistors, a polysilicon thin film transistor is formed by crystallizing an amorphous silicon thin film transistor using a laser scan, and the third and fourth thin film transistors $T_3$ and $T_4$ are formed in the same plane.

Referring to FIG. 13A, the third and fourth amorphous silicon thin film transistors $T_3$ and $T_4$ are formed on the same plane of a glass substrate. The gate electrodes G of the third and fourth amorphous silicon-thin film transistors $T_3$ and $T_4$ are formed in parallel to each other, and the source and drain electrodes S, D of the third and fourth amorphous silicon-thin film transistors $T_3$ and $T_4$ are formed to be collinearly arranged (i.e., aligned in a same line) in a direction substantially perpendicular to the laser scan direction that is substantially parallel to the gate electrodes G. Then, the amorphous silicon thin film transistors $T_3$, $T_4$ are subjected to the laser scan to be crystallized and transformed into the polysilicon thin film transistors.

FIG. 13B is a schematic diagram for describing a method of fabricating the third and fourth thin film transistors $T_3$ and $T_4$ according to another embodiment of the present invention. The third and fourth amorphous silicon thin film transistors $T_3$ and $T_4$ are formed on the same plane of the glass substrate. Then, the gate electrodes G of the third and fourth amorphous silicon thin film transistors $T_3$ and $T_4$ are collinearly formed, and the source and drain electrodes S, D of the third and fourth amorphous silicon-thin film transistors $T_3$, $T_4$ are formed substantially parallel to the laser scan direction. The gate electrodes G are formed in a collinear direction substantially perpendicular to the laser scan direction. Upon being subjected to the laser scan, the amorphous silicon-thin film transistors are crystallized and transformed into the polysilicon thin film transistors.

When crystallizing the amorphous silicon-thin film transistors through the laser annealing process, a mask for forming a laser beam pattern on the glass substrate and a zoom lens for exposing a pattern of the mask to the glass substrate by zooming-out the pattern are prepared. In detail, a laser beam is adjusted to have a uniform distribution, and the laser beam pattern to be formed on the glass substrate through the mask is determined. For example, a light source is employed to generate a line beam from its tip. In this case, a line-shaped mask is also used. In other method, another mask in addition to the line-shaped mask may be used between the glass substrate and the light source to form a specific pattern.

Then, the laser beam is adjusted to have a selected beam width by means of a zoom-out lens. In case of employing the line-shaped mask alone, the beam width is in a range from several millimeters to several centimeters and the length is from several centimeters to several tens centimeters (or up to about 2 meters). In case of employing another mask in addition to the line-shaped mask, the beam width is in a range from several micrometers to several millimeters. The amorphous silicon thin film transistors are crystallized by radiating the laser beam onto the glass substrate while moving the glass substrate or the laser beam on the X-Y plane, so that the amorphous silicon thin film transistors are transformed into the polysilicon thin film transistors.

Figure 14:
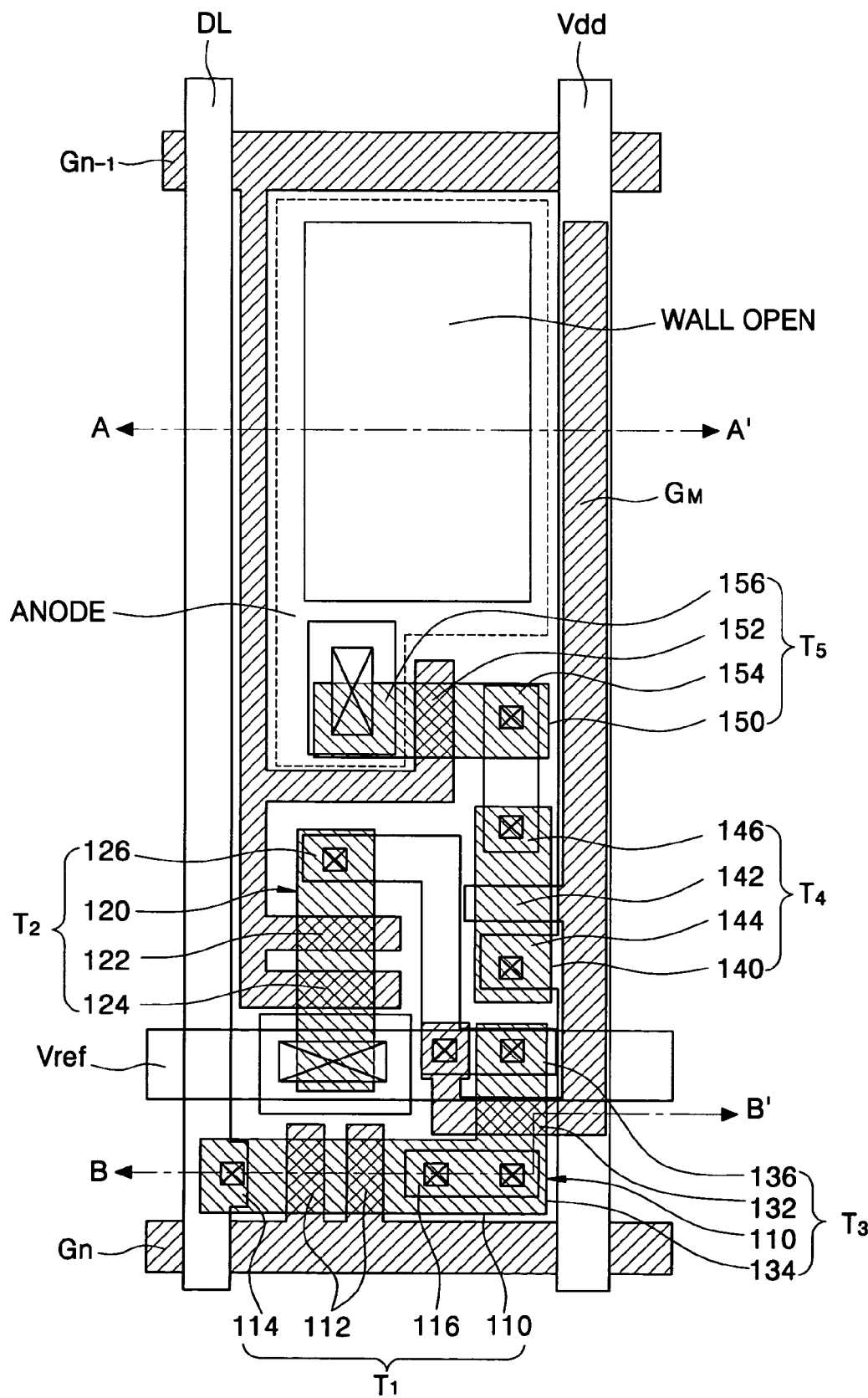
FIG. 14 is a plan view of the pixel driving unit in FIG. 3.
Figure 15:
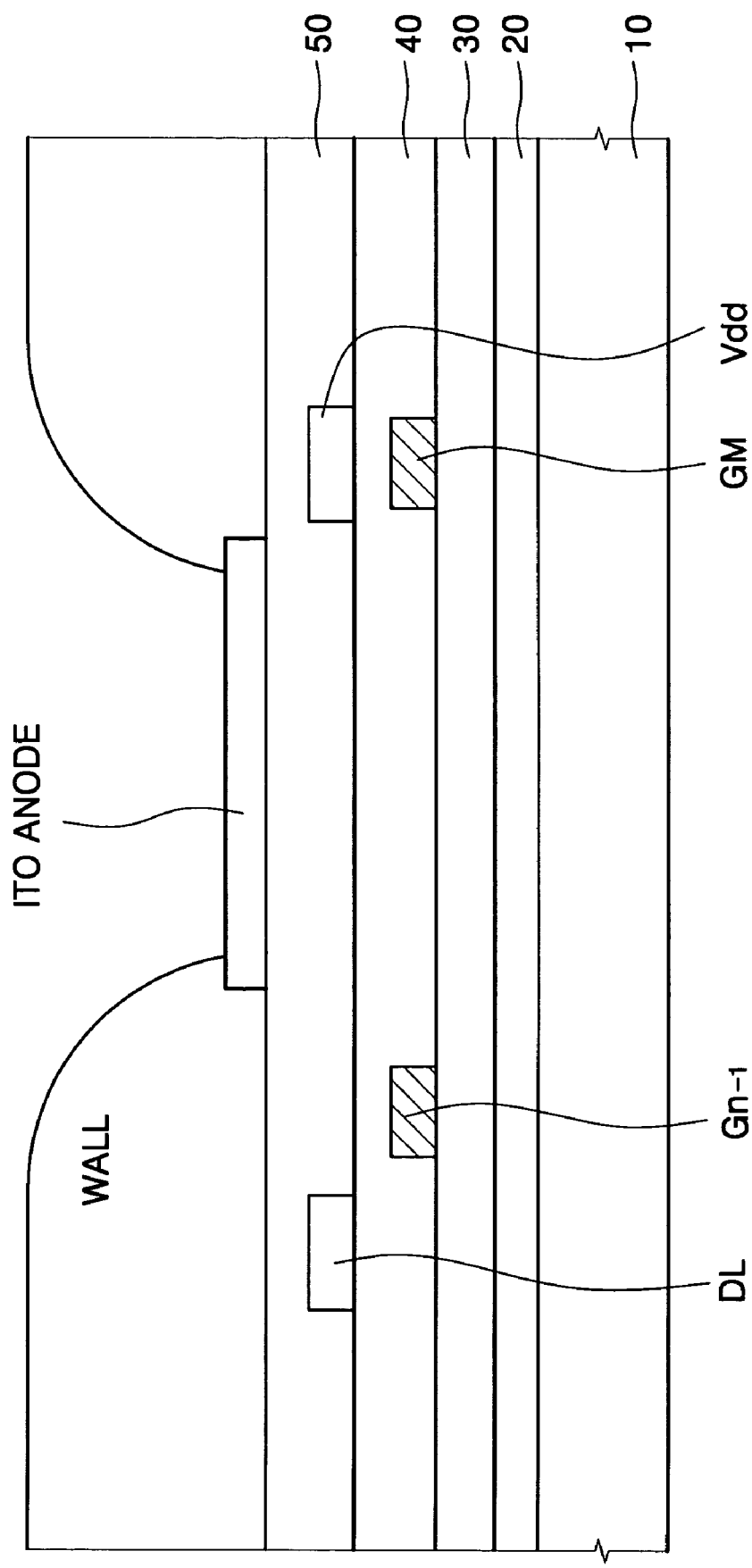
FIGS. 15 and 16 are cross-sectional views of the pixel driving unit taken along lines A–A' and B–B', respectively, in FIG. 14.
Figure 16:
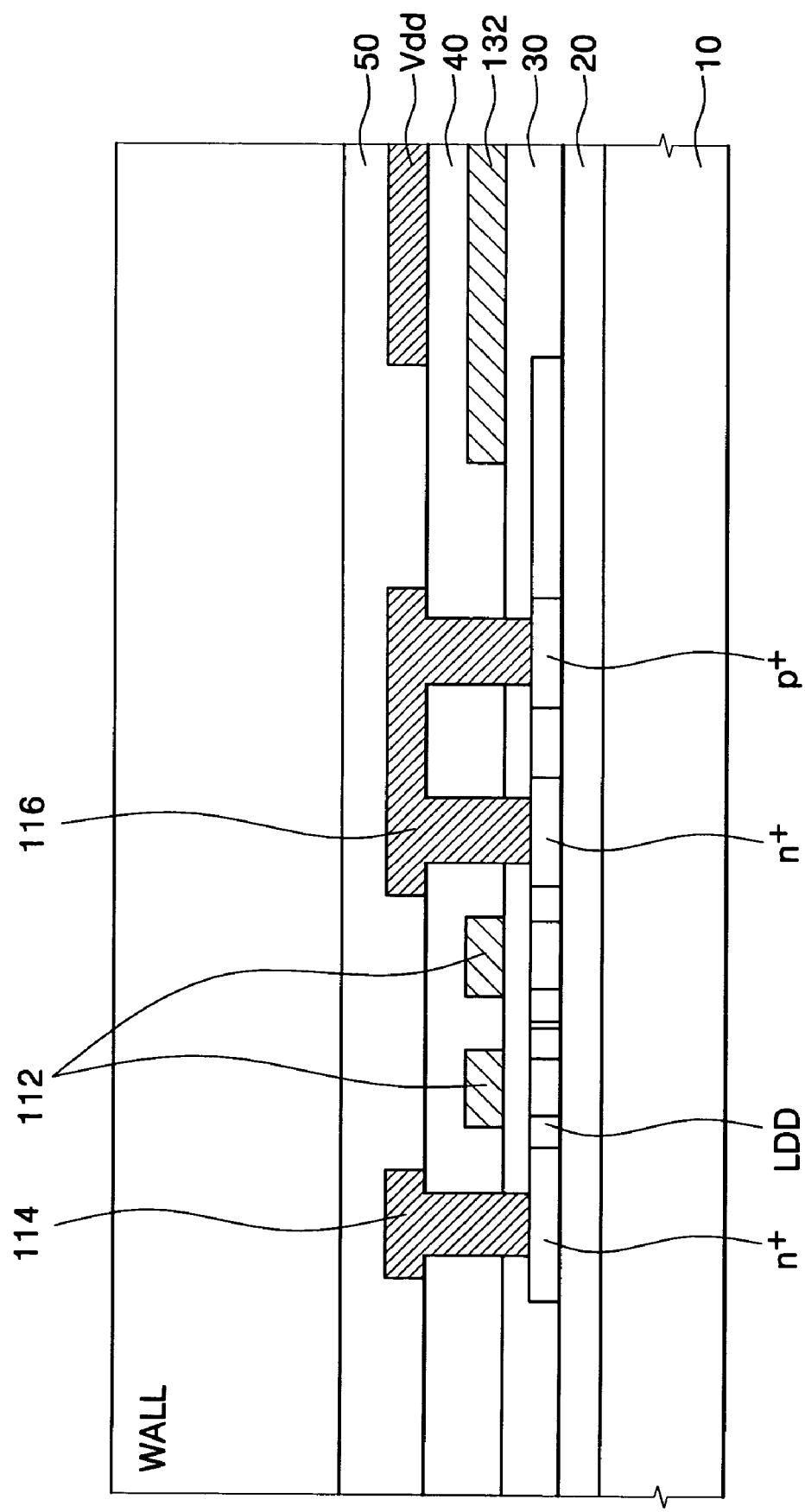

FIG. 14 is a plan view of the pixel driving unit for an OLED device in FIG. 3. FIGS. 15 and 16 are cross-sectional views of the pixel driving unit taken along lines A–A' and B–B', respectively, in FIG. 14. As shown in FIGS. 15 and 16, the pixel driving unit is formed in multiple layers, such as an insulation substrate 10 including glass, quartz, and/or sapphire, a blocking layer 20, a gate insulating layer 30, an interlayer dielectric 40, and a passivation layer 50.

Referring to FIGS. 14 to 16, the blocking layer 20 is formed on the glass substrate 20 by depositing silicon oxide on the glass substrate 20 at a thickness of about 2000 Å through a plasma-enhanced chemical vapor deposition process. On the blocking layer 20, five thin film transistors $T_1$–$T_5$, one storage capacitor C, and five wirings Gn–1, Gn, DL, Vdd, $V_{ref}$ are formed. The blocking layer 20 is provided to prevent thermal loss while crystallizing an amorphous-silicon layer to form a polysilicon layer.

One pixel driving unit is defined by first and second gate lines Gn–1, Gn extending in a first direction, a data line DL extending in a second direction substantially perpendicular to the first direction, and a power supply line Vdd extending in the second direction. A reference voltage line $V_{ref}$ extends in the first direction and is disposed between the first and second gate lines Gn–1, Gn.

In detail, the first gate line Gn–1 turns on/off the first thin film transistor $T_1$ of a pixel driving unit in the previous column, so that an initial data signal and a gray-scale data signal are provided through the data line DL. Also, the first gate line Gn–1 turns on/off the second and fifth thin film transistors $T_2$, $T_5$ of the pixel driving unit in the current column.

The second gate line Gn turns on/off the first thin film transistor $T_1$ of the pixel driving unit in the current column to perform a switching function, so that an initial data signal and a gray-scale data signal are provided to the pixel driving unit through the data line DL. Also, the second gate line Gn turns on/off the second and fifth thin film transistors $T_2$, $T_5$ of a pixel driving unit in the next column. Through the power supply line Vdd, the maximum value of a display signal is constantly applied in the form of direct current to the pixel driving unit. Through the reference voltage line, the reference voltage $V_{ref}$ is applied to the second thin film transistor $T_2$.

Referring to FIG. 14, the first thin film transistor $T_1$ includes a first active pattern 110 disposed at an area adjacent to a cross point between the second gate line Gn and the data line DL, a gate electrode 112 extending from the second gate line Gn and passing above the first active pattern 110, a source electrode 114 extending from the data line DL and making contact with the first active pattern 110 aligned at one side of the gate electrode 112, and a first drain electrode 116 making contact with the first active pattern 110 aligned at the other side of the gate electrode 112. The gate electrode 112 and the source electrode 114 of the first thin film transistor $T_1$ are connected to the second gate line Gn and the data line DL, respectively.

The second thin film transistor $T_2$ includes a second active pattern 120, a gate electrode 122 extending from the first gate line Gn−1 and passing above the second active pattern 120, a source electrode 124 extending from the reference voltage line $V_{ref}$ and making contact with the second active pattern 120 aligned at one side of the gate electrode 122, and a drain electrode 126 making contact with the second active pattern 120 aligned at the other side of the gate electrode 122.

The third thin film transistor $T_3$ includes the first active pattern 110, a gate electrode 132 extending from a metal line $G_M$, which is formed when the first gate line Gn−1 is formed, and passing above the first active pattern 110, a source electrode 134 extending from the reference voltage line $V_{ref}$ and making contact with the first active pattern 110 aligned at one side of the gate electrode 132, and a drain electrode 136 making contact with the first active pattern 110 aligned at the other side of the gate electrode 132.

The fourth thin film transistor $T_4$ includes a third active pattern 140, a gate electrode 142 extending from the metal line $G_M$ and passing above the third active pattern 140, a source electrode 144 extending from the reference voltage line $V_{ref}$ and making contact with the third active pattern 140 aligned at one side of the gate electrode 142, and a drain electrode 146 making contact with the third active pattern 140 aligned at the other side of the gate electrode 142.

The fifth thin film transistor $T_5$ includes a fourth active pattern 150, a gate electrode 152 extending from the first gate line Gn−1 and passing above the fourth active pattern 150, a source electrode 154 extending from the drain electrode 147 of the fourth thin film transistor $T_4$ and making contact with the fourth active pattern 150 aligned at one side of the gate electrode 152, and a drain electrode 156 making contact with the fourth active pattern 150 aligned at the other side of the gate electrode 152 and making contact with an anode electrode of the OLED device.

In this embodiment, the first and second thin film transistors $T_1$, $T_2$ are N-type thin film transistors, and the third to fifth thin film transistors $T_3$–$T_5$ are P-type thin film transistors. The storage capacitor Cst is defined by the metal line $G_M$ formed when forming the first gate line and the power supply line Vdd formed above the metal line $G_M$. The storage capacitor Cst constantly maintains data voltage for one frame time.

After forming the five thin film transistors $T_1$–$T_5$, the storage capacitor Cst, and the five wirings Gn−1, Gn, DL, Vdd, $V_{ref}$, an ITO anode electrode is formed on the top portion of the pixel driving unit and exposed through an opening. Also, a hole transfer layer, a light emitting layer and an electron transfer layer are sequentially formed on an organic insulating wall of the pixel driving unit, and a cathode electrode is formed thereon. In this embodiment, the third and fourth thin film transistors are disposed in a direction parallel to the data line, so that the characteristics of the third and fourth thin film transistors become similar or substantially identical to each other when the amorphous silicon-thin film transistors are crystallized through a laser scan process.

As describe above, the pixel driving unit according to the present invention compensates for the threshold voltage of a driving thin film transistor in the respective pixel driving units of an OLED device. The effective gate-source voltage of the driving thin film transistor is only dependent on a data voltage and a bias voltage externally applied and independent of the threshold voltage of the driving thin film transistor, so that each OLED diode receives a driving signal with the same intensity in response to the same data signal.

While the invention has been described with reference to the exemplary embodiments, it will be understood by those skilled in the art that various changes may be made and equivalents may be substituted for elements thereof without departing form the scope of the invention. In addition, many modifications may be made to adapt a particular situation or material to the teachings of the invention without departing from the essential scope thereof. Therefore, it is intended that the invention may not be limited to the particular embodiment disclosed as the best mode contemplated for carrying out this invention, but that the invention will include all embodiments falling within the scope of the intended claims.

What is claimed is:

1. An apparatus for providing a driving signal to an organic light emitting diode in an image display device, comprising:

first and second control lines for transferring previous and current control signals, respectively, in a sequential process for providing the driving signal to the organic light emitting diode;

a data line for transferring a data signal for displaying images on the image display device;

a first switching device including a conduction path for transferring the data signal from the data line, the conduction path of the first switching device being controlled by the current control signal from the second control line;

a second switching device including a conduction path for transferring a reference signal externally supplied, the conduction path of the second switching device being controlled by the previous control signal from the first control line;

a third switching device including a conduction path for transferring the data signal provided from the first switching device, the conduction path of the third switching device being controlled by a state of the second switching device;

a fourth switching device including a conduction path for transferring a bias voltage, the conduction path of the fourth switching device being controlled by one of the reference signal from the second switching device and the data signal from the third switching device; and a fifth switching device including a conduction path for receiving a bias voltage from the fourth switching device and generating the driving signal to the organic light emitting diode, the conduction path being controlled by the previous gate signal from the first gate line.

2. The apparatus of claim 1, wherein the third and fourth switching devices have switching characteristics substantially identical to each other.

3. The apparatus of claim 2, further including a capacitor for being charged with the bias voltage and for providing a voltage signal to control the conduction path of the third switching device.

4. The apparatus of claim 3, wherein the first, second, third and fourth switching devices are first, second, third and fourth thin film transistors, respectively, each having a conduction path between a source and a drain and a gate for receiving a control signal to control the conduction path; the first and second control signal lines are first and second gate lines, respectively; and the previous and current control signals are previous and current gate signals, respectively.

5. The apparatus of claim 4, wherein the first, second, third and fourth thin film transistors are polysilicon thin film transistors.

6. The apparatus of claim 4, wherein the first thin film transistor has a gate to which the current gate signal is applied from the second gate line and a source and a drain to form the conduction path for transferring the data signal; the second thin film transistor has a gate to which the previous gate signal is applied from the first gate line and a source and a drain to form the conduction path for transferring the reference signal; the third thin film transistor has a gate to which the voltage signal from the capacitor is applied and a source and a drain to form the conduction path for transferring the data signal; and the fourth thin film transistor has a gate to which one of the reference signal from the second thin film transistor and the data signal from the third thin film transistor is applied and a source and a drain to form the conduction path between the bias voltage and the fifth switching device.

7. The apparatus of claim 6, wherein the conduction path of the second thin film transistor and the conduction path of the third thin film transistor are connected to the gate of the fourth thin film transistor and are parallel to each other with respect to the gate of the fourth thin film transistor.

8. The apparatus of claim 6, wherein the gate of the third thin film transistor is connected with the gate of the fourth thin film transistor.

9. The apparatus of claim 6, wherein the third and fourth thin film transistors have a substantially identical threshold voltage.

10. The apparatus of claim 9, wherein the threshold voltage of the third and fourth thin film transistors has a negative value.

11. The apparatus of claim 6, wherein the first and second thin film transistors are N-type thin film transistors, and the third and fourth thin film transistors are P-type thin film transistors.

12. The apparatus of claim 11, wherein the voltage of the reference signal is equal to or larger than a gate-off voltage of the first thin film transistor and is equal to or less than a sum of a threshold voltage of the third thin film transistor and a minimum voltage value of the data signal.

13. The apparatus of claim 6, wherein an effective gate-source voltage of the fourth thin film transistor is dependent on the bias voltage and the data signal and independent of a threshold voltage of the fourth thin film transistor.

14. The apparatus of claim 6, wherein the bias voltage is provided from a power supply line disposed substantially parallel with the data line.

15. The apparatus of claim 6, wherein the fifth switching device is a fifth thin film transistor having a conduction path between a source and a drain and a gate for receiving a control signal to control the conduction path,
wherein the conducting path is between the fourth thin film transistor and the organic light emitting diode, the conduction path being controlled by the previous gate signal from the first gate line.

16. The apparatus of claim 15, wherein the fifth thin film transistor is a P-type thin film transistor having a source and a drain forming the conduction path and a gate receiving the previous gate signal.

17. The apparatus of claim 6, wherein the source of the second thin film transistor is connected with the second gate line, so that the conduction path of the second thin film transistor transfers the current gate signal to the fourth thin film transistor as the reference signal.

18. The apparatus of claim 6, wherein the bias voltage is provided from a power supply line disposed substantially parallel with the first and second gate lines.

19. The apparatus of claim 18, further including a fifth thin film transistor having a conduction path between the fourth thin film transistor and the organic light emitting diode, the conduction path being controlled by the current gate signal from the second gate line.

20. The apparatus of claim 19, wherein the fifth thin film transistor is a P-type thin film transistor having a source and a drain forming the conduction path and a gate receiving the current gate signal.

21. The apparatus of claim 18, further including:
a fifth thin film transistor having a conduction path for transferring the driving signal from the fourth thin film transistor, the conduction path being controlled by the previous gate signal from the first gate line; and
a sixth thin film transistor having a conduction path for transferring the driving signal from the fifth thin film transistor to the organic light emitting diode, the conduction path of the sixth thin film transistor being controlled by the current gate signal from the second gate line.

22. The apparatus of claim 21, wherein the fifth thin film transistor is a P-type thin film transistor having a source and a drain forming the conduction path for transferring the driving signal from the fourth thin film transistor and a gate receiving the previous gate signal, and the sixth thin film transistor is n N-type thin film transistor having a source and a drain forming the conduction path for transferring the driving signal from the fifth thin film transistor and a gate receiving the current gate signal.

23. The apparatus of claim 6, further comprising a fifth thin film transistor having a conduction path between the fourth thin film transistor and the organic light emitting diode, the conduction path being controlled by the previous gate signal from the first gate line,
wherein the first, second, third and fourth thin film transistors are P-type thin film transistors, and the fifth thin film transistor is an N-type thin film transistor.

24. The apparatus of claim 23, wherein the reference voltage is larger than a gate-off voltage of the first thin film transistor.

25. The apparatus of claim 24, wherein the reference voltage is smaller than a sum of a threshold voltage of the third thin film transistor and a minimum voltage value of the data signal.

26. An organic light emitting display device comprising:
a plurality of gate lines to which an active gate line is sequentially supplied;
a plurality of data lines to which data signals are applied to display images on the organic light emitting display device; and
a plurality of pixel driving units each of which provides a driving signal to a corresponding OLE diode in association with a pair of the gate lines and at least one of the plurality of data lines, wherein each of the pixel driving units includes:
a first driving transistor having a conduction path with one terminal receiving a bias voltage and the other terminal providing the bias voltage to second driving transistor, wherein the second driving transistor has a conduction path with one terminal receiving the bias voltage and the other terminal providing the driving signal to the diode;

a first switching transistor having a conduction path for transferring a reference signal, the conduction path of the first switching transistor being controlled by a previous gate signal; and a second switching transistor having a conduction path for transferring a data signal, the conduction path of the second switching transistor being controlled by a state of the first switching transistor, wherein the conduction path of the first driving transistor is controlled by one of the reference signal from the first switching transistor and the data signal from second switching transistor.

27. The organic light emitting display device of claim 26, wherein a plurality of gate lines including a dummy gate line for providing a gate signal to the first switching transistor of a first one of the pixel driving units.

28. The organic light emitting display device of claim 27, wherein the dummy gate line is synchronized with a last one of the gate lines.

29. The organic light emitting display device of claim 27, wherein a same gate signal is applied to the dummy gate line and a last one of the gate lines simultaneously.

30. The organic light emitting display device of claim 26, wherein each of the pixel driving units further includes a third switching transistor having a conduction path for transferring the data signal from a corresponding one of the data lines to the second switching transistor, the conduction path of the third switching transistor being controlled by the current gate signal.

31. The organic light emitting display device of claim 26, wherein the first driving transistor and the second switching transistor have a substantially identical threshold voltage.

32. The organic light emitting display device of claim 26, further including a plurality of power supply lines each of which is associated with a corresponding one of the pixel driving units for providing the bias voltage to the corresponding pixel driving unit, wherein the power supply lines are parallel with the data lines.

33. The organic light emitting display device of claim 26, further including a plurality of power supply lines each of which is associated with a corresponding one of the pixel driving units for providing the bias voltage to the corresponding pixel driving unit, wherein the power supply lines are parallel with the gate lines.

34. The organic light emitting display device of claim 26, wherein the first driving transistor, and first and second switching transistors are thin film transistors each having a source and a drain forming a conduction path and a gate receiving a gate signal to control the conduction path.

* * * * *